US011616068B1

(12) United States Patent
Vimercati

(10) Patent No.: US 11,616,068 B1
(45) Date of Patent: Mar. 28, 2023

(54) DECK SELECTION LAYOUTS IN A MEMORY DEVICE

(71) Applicant: Micron Technology, Inc., Boise, ID (US)

(72) Inventor: Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/528,018

(22) Filed: Nov. 16, 2021

(51) Int. Cl.
*H01L 27/11* (2006.01)
*H01L 27/11507* (2017.01)
*H01L 27/11514* (2017.01)
*G11C 11/22* (2006.01)
*H01L 27/11509* (2017.01)

(52) U.S. Cl.
CPC ...... *H01L 27/11507* (2013.01); *G11C 11/221* (2013.01); *G11C 11/2259* (2013.01); *H01L 27/11509* (2013.01); *H01L 27/11514* (2013.01)

(58) Field of Classification Search
None
See application file for complete search history.

(56) References Cited

U.S. PATENT DOCUMENTS

| | | | | |
|---|---|---|---|---|
| 6,859,380 | B2* | 2/2005 | Ashikaga | G11C 11/22 365/189.09 |
| 2015/0162063 | A1* | 6/2015 | Mueller | G11C 11/221 365/145 |
| 2019/0392884 | A1* | 12/2019 | Ong | G11C 11/221 |
| 2021/0304804 | A1* | 9/2021 | Vimercati | G11C 11/2257 |

* cited by examiner

*Primary Examiner* — Tan T. Nguyen
(74) *Attorney, Agent, or Firm* — Holland & Hart, LLP

(57) ABSTRACT

Methods, systems, and devices for deck selection layouts in a memory device are described. In some implementations, a tile of a memory array may be associated with a level above a substrate, and may include a set of memory cells, a set of digit lines, and a set of word lines. Selection transistors associated with a tile of memory cells may be operable for coupling digit lines of the tile with circuitry outside the tile, and may be activated by various configurations of one or more access lines, where the various configurations may be implemented to trade off or otherwise support design and performance characteristics such as power consumption, layout complexity, operational complexity, and other characteristics. Such techniques may be implemented for other aspects of tile operations, including memory cell shunting or equalization, tile selection using transistors of a different level, or signal development, or various combinations thereof.

25 Claims, 11 Drawing Sheets

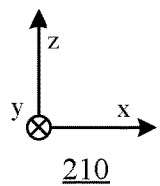
210
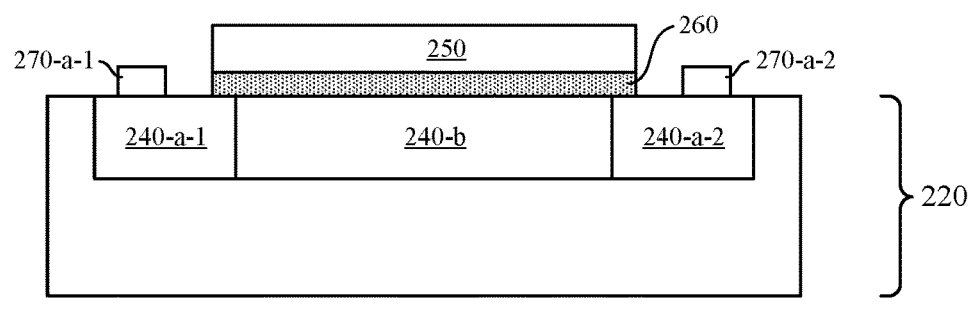
FIG. 2

Perform an access operation on a row of memory cells of a level above a substrate of a memory die Bias a word line to activate a plurality of first transistors of the level above the substrate for coupling a respective storage element of each memory cell of the row of memory cells with each digit line of a plurality of digit lines Bias a first activation line to activate a plurality of second transistors of the level above the substrate for coupling a respective digit line of a first set of digit lines of the plurality of digit lines with circuitry outside the level above the substrate

1005

Bias a second activation line to activate a plurality of third transistors of the level above the substrate for coupling a respective digit line of a second set of digit lines of the plurality of digit lines with the circuitry that outside the level above the substrate

DECK SELECTION LAYOUTS IN A MEMORY DEVICE

FIELD OF TECHNOLOGY

The following relates generally to a system that includes at least one memory device and more specifically to deck selection layouts in a memory device.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D Xpoint), not-or (NOR), and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

BRIEF DESCRIPTION OF THE DRAWINGS

FIG. 2 illustrates an example of a transistor structure that supports deck selection layouts in a memory device in accordance with examples as disclosed herein.

FIGS. 10 and 11 show flowcharts illustrating a method or methods that support deck selection layouts in a memory device in accordance with examples as disclosed herein.

DETAILED DESCRIPTION

Memory devices may include memory arrays distributed on one or more levels above a substrate of a memory die (e.g., a semiconductor die, a semiconductor wafer or chip), and may include circuitry configured to select a particular portion of a memory array. For example, memory cells of a memory die may be arranged in a plurality of tiles (e.g., patches, subarrays) formed over a substrate of the memory die, where a tile may be defined by or otherwise include a first set of access lines (e.g., a set of word lines) aligned along a first direction and a second set of access lines (e.g., a set of digit lines) aligned along a second direction. A tile may be selected or enabled by a set of transistors (e.g., deck selection transistors, tile selection transistors, transistors of or otherwise associated with the tile) configured to couple a respective digit line of the tile with circuitry outside the tile, such as signal development circuitry, sensing circuitry, or decoding circuitry, among other examples, at least some of which may be located on another level of the memory device (e.g., at a substrate level, at another level above a substrate). Selection transistors such as deck selection transistors may be enabled by access lines (e.g., selection lines, activation lines) coupled with gates of the transistors, and the activation of such access lines may be associated with a power consumption or latency.

In accordance with examples as disclosed herein, selection transistors of or associated with a tile of memory cells may be activated by various configurations of one or more access lines, where the various configurations may be implemented to trade off or otherwise support design and performance characteristics such as power consumption, layout complexity, operational complexity, and other characteristics. The described techniques may be implemented for (e.g., combined with) other aspects of tile operations, including memory cell shunting or equalization, tile selection using transistors of a different level, or signal development (e.g., by operating selection transistors in accordance with a cascode configuration), or various combinations thereof.

Features of the disclosure are initially described in the context of a memory device, memory structures, and related circuitry as described with reference to FIGS. 1 through 5. Features of the disclosure are described in the context of example memory tile layouts as described with reference to FIGS. 6 through 9. These and other features of the disclosure are further illustrated by and described with reference to flowcharts that relate to deck selection layouts in a memory device as described with references to FIGS. 10 through 11.

Figure 1:
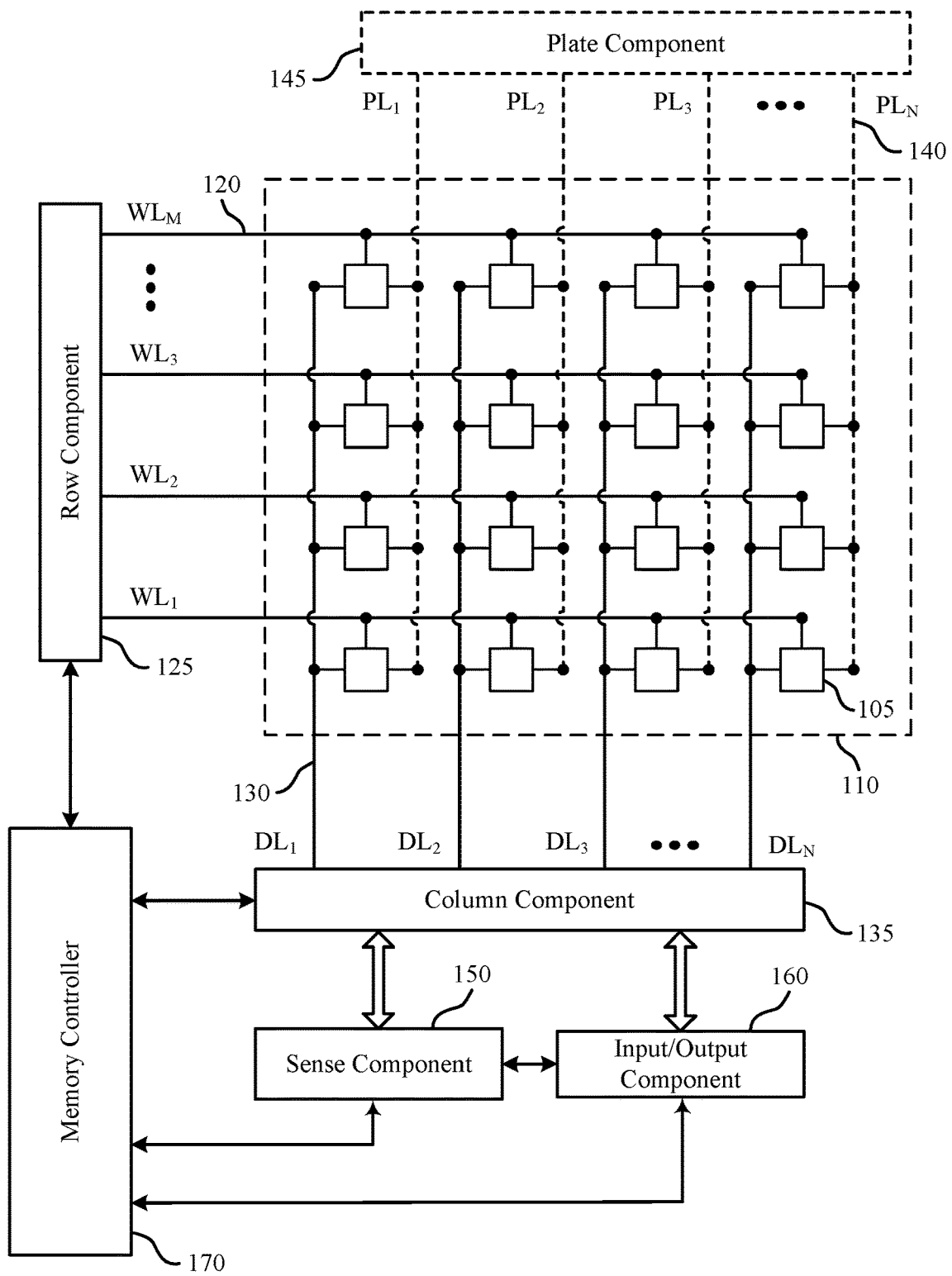
FIG. 1 illustrates an example of a memory device that supports deck selection layouts in a memory device in accordance with examples as disclosed herein.

FIG. 1 illustrates an example of a memory device 100 that supports deck selection layouts in a memory device in accordance with examples as disclosed herein. The memory device 100 may also be referred to as a memory die or an electronic memory apparatus. The memory device 100 may include memory cells 105 that are programmable to store different logic states. In some cases, a memory cell 105 may be programmable to store two logic states, denoted a logic 0 and a logic 1. In some cases, a memory cell 105 may be programmable to store more than two logic states (e.g., as a multi-level cell). The set of memory cells 105 may be part of a memory array 110 of the memory device 100, where, in some examples, a memory array 110 may refer to a contiguous tile of memory cells 105 (e.g., a contiguous set of elements of a semiconductor chip).

In some examples, a memory cell 105 may store an electric charge representative of the programmable logic states (e.g., storing charge in a capacitor, capacitive memory element, or capacitive storage element). In some examples, a charged and uncharged capacitor may represent two logic states, respectively. In some other examples, a positively charged (e.g., a first polarity, a positive polarity) and negatively charged (e.g., a second polarity, a negative polarity)

capacitor may represent two logic states, respectively. DRAM or FeRAM architectures may use such designs, and the capacitor employed may include a dielectric material with linear or para-electric polarization properties as an insulator. In some examples, different levels of charge of a capacitor may represent different logic states, which, in some examples, may support more than two logic states in a respective memory cell 105.

In some examples, such as FeRAM architectures, a memory cell 105 may include a ferroelectric capacitor having a ferroelectric material as an insulating (e.g., non-conductive) layer between terminals of the capacitor. Different levels or polarities of polarization of a ferroelectric capacitor may represent different logic states (e.g., supporting two or more logic states in a respective memory cell 105).

In some examples, a memory cell 105 may include or otherwise be associated with a configurable material, which may be referred to as a material memory element, a material storage element, a material portion, and others. The configurable material may have one or more variable and configurable characteristics or properties (e.g., material states) that may represent different logic states. For example, a configurable material may take different forms, different atomic configurations, different degrees of crystallinity, different atomic distributions, or otherwise maintain different characteristics that may be leveraged to represent one logic state or another. In some examples, such characteristics may be associated with different electrical resistances, different threshold characteristics, or other properties that are detectable or distinguishable during a read operation to identify a logic state written to or stored by the configurable material.

In some cases, a configurable material of a memory cell 105 may be associated with a threshold voltage. For example, electrical current may flow through the configurable material when a voltage greater than the threshold voltage is applied across the memory cell 105, and electrical current may not flow through the configurable material, or may flow through the configurable material at a rate below some level (e.g., according to a leakage rate), when a voltage less than the threshold voltage is applied across the memory cell 105. Thus, a voltage applied to memory cells 105 may result in different current flow, or different perceived resistance, or a change in resistance (e.g., a thresholding or switching event) depending on whether a configurable material portion of the memory cell 105 was written with one logic state or another. Accordingly, the magnitude of current, or other characteristic (e.g., thresholding behavior, resistance breakdown behavior, snapback behavior) associated with the current that results from applying a read voltage to the memory cell 105, may be used to determine a logic state written to or stored by memory cell 105.

In the example of memory device 100, each row of memory cells 105 may be coupled with one or more word lines 120 (e.g., WL1 through WLM), and each column of memory cells 105 may be coupled with one or more digit lines 130 (e.g., DL1 through DLN). Each of the word lines 120 and digit lines 130 may be an example of an access line of the memory device 100. In general, one memory cell 105 may be located at the intersection of (e.g., coupled with, coupled between) a word line 120 and a digit line 130. This intersection may be referred to as an address of a memory cell 105. A target or selected memory cell 105 may be a memory cell 105 located at the intersection of an energized or otherwise selected word line 120 and an energized or otherwise selected digit line 130.

In some architectures, a storage component of a memory cell 105 may be electrically isolated (e.g., selectively isolated) from a digit line 130 by a cell selection component, which, in some examples, may be referred to as a switching component or a selector device of or otherwise associated with the memory cell 105. A word line 120 may be coupled with the cell selection component (e.g., via a control node or terminal of the cell selection component), and may control the cell selection component of the memory cell 105. For example, the cell selection component may be a transistor and the word line 120 may be coupled with a gate of the transistor (e.g., where a gate node of the transistor may be a control node of the transistor). Activating a word line 120 may result in an electrical connection or closed circuit between a respective logic storing component of one or more memory cells 105 and one or more corresponding digit lines 130, which may be referred to as activating the one or more memory cells 105 or coupling the one or more memory cells 105 with a respective one or more digit lines 130. A digit line 130 may then be accessed to read from or write to the respective memory cell 105.

In some examples, memory cells 105 may also be coupled with one or more plate lines 140 (e.g., PL1 through PLN), or other configurations of a plate node. In some examples, each of the plate lines 140 may be independently addressable (e.g., supporting individual selection or biasing). In some examples, at least a subset of the plurality of plate lines 140 may represent or be otherwise functionally equivalent with a common plate, or other common node (e.g., a plate node common to each of the memory cells 105 in the memory array 110, or some subset thereof). When a memory cell 105 employs a capacitor for storing a logic state, a digit line 130 may provide access to a first terminal or a first plate of the capacitor, and a plate line 140 or other plate node may provide access to a second terminal or a second plate of the capacitor. Although the plurality of plate lines 140 of the memory device 100 are shown as substantially parallel with the plurality of digit lines 130, in other examples, a plurality of plate lines 140 may be substantially parallel with the plurality of word lines 120, or in any other configuration (e.g., a common planar conductor, a common plate layer, a common plate node).

Access operations such as reading, writing, rewriting, and refreshing may be performed on a memory cell 105 by activating or selecting a word line 120, a digit line 130, or a plate line 140 coupled with the memory cell 105, which may include applying a voltage, a charge, or a current to the respective access line. Upon selecting a memory cell 105 (e.g., in a read operation), a resulting signal may be used to determine the logic state stored by the memory cell 105. For example, a memory cell 105 with a capacitive memory element storing a logic state may be selected, and the resulting flow of charge via an access line or resulting voltage of an access line may be detected to determine the programmed logic state stored by the memory cell 105.

Accessing memory cells 105 may be controlled using a row component 125 (e.g., a row decoder), a column component 135 (e.g., a column decoder), or a plate component 145 (e.g., a plate decoder), or a combination thereof. For example, a row component 125 may receive a row address from the memory controller 170 and activate a corresponding word line 120 based on the received row address. Similarly, a column component 135 may receive a column address from the memory controller 170 and activate a corresponding digit line 130. In some examples, such access operations may be accompanied by a plate component 145 biasing one or more of the plate lines 140 (e.g., biasing one of the plate lines 140, biasing some or all of the plate lines 140, biasing a common plate, biasing a plate node).

In some examples, the memory controller 170 may control operations (e.g., read operations, write operations, rewrite operations, refresh operations) of memory cells 105 using one or more components (e.g., row component 125, column component 135, plate component 145, sense component 150). In some cases, one or more of the row component 125, the column component 135, the plate component 145, and the sense component 150 may be co-located or otherwise included with the memory controller 170. The memory controller 170 may generate row and column address signals to activate a desired word line 120 and digit line 130. The memory controller 170 may also generate or control various voltages or currents used during the operation of memory device 100.

A memory cell 105 may be read (e.g., sensed) by a sense component 150 when the memory cell 105 is accessed (e.g., in cooperation with the memory controller 170) to determine a logic state written to or stored by the memory cell 105. For example, the sense component 150 may be configured to evaluate a current or charge transfer through or from the memory cell 105, or a voltage resulting from coupling the memory cell 105 with the sense component 150, responsive to a read operation. The sense component 150 may provide an output signal indicative of the logic state read from the memory cell 105 to one or more components (e.g., to the column component 135, the input/output component 160, to the memory controller 170).

A sense component 150 may include various switching components, selection components, transistors, amplifiers, capacitors, resistors, or voltage sources to detect or amplify a difference in sensing signals (e.g., a difference between a read voltage and a reference voltage, a difference between a read current and a reference current, a difference between a read charge and a reference charge), which, in some examples, may be referred to as latching. In some examples, a sense component 150 may include a collection of components (e.g., circuit elements) that are repeated for each of a set or subset of digit lines 130 connected to the sense component 150. For example, a sense component 150 may include a separate sensing circuit (e.g., a separate or duplicated sense amplifier, a separate or duplicated signal development component) for each of a set of digit lines 130 coupled with the sense component 150, such that a logic state may be separately detected for a respective memory cell 105 coupled with a respective one of the set of digit lines 130.

A memory cell 105 may be set, or written, by activating the relevant word line 120, digit line 130, or plate line 140 (e.g., via a memory controller 170). In other words, a logic state may be stored in a memory cell 105. A row component 125, column component 135, or plate component 145 may accept data, for example, via input/output component 160, to be written to the memory cells 105. In some examples, a write operation may be performed at least in part by a sense component 150, or a write operation may be configured to bypass a sense component 150.

In the case of a capacitive memory element, a memory cell 105 may be written by applying a voltage to or across a capacitor, and then isolating the capacitor (e.g., isolating the capacitor from a voltage source used to write the memory cell 105, floating the capacitor) to store a charge in the capacitor associated with a desired logic state. In the case of ferroelectric memory, a ferroelectric memory element (e.g., a ferroelectric capacitor) of a memory cell 105 may be written by applying a voltage with a magnitude high enough to polarize the ferroelectric memory element (e.g., applying a saturation voltage) with a polarization associated with a desired logic state, and the ferroelectric memory element may be isolated (e.g., floating), or a zero net voltage or bias may be applied across the ferroelectric memory element (e.g., grounding, virtually grounding, or equalizing a voltage across the ferroelectric memory element). In the case of a material memory architecture, a memory cell 105 may be written by applying a current, voltage, or other heating or biasing to a material memory element to configure the material according to a corresponding logic state.

In some examples, the memory device 100 may include multiple memory arrays 110 arranged in a stack of decks or levels relative to a substrate of the memory device 100 (e.g., a semiconductor substrate, a crystalline silicon substrate, a crystalline semiconductor substrate, a portion of a semiconductor wafer). In some examples, memory cells 105 of the memory die may be arranged in a plurality of tiles (e.g., patches, subarrays) over the substrate. For example, a tile may be defined by or otherwise include a set of word lines 120 aligned along a first direction and a set of digit lines 130 aligned along a second direction. In various examples, tiles may be arranged in one or more decks or levels relative to the substrate of the memory device 100.

Circuitry that supports accessing or operating the multiple memory arrays 110 may be located below one or more memory arrays 110, which may refer to a location that is at least in part between the memory arrays 110 and the substrate. For example, one or more row components 125, one or more column components 135, one or more plate components 145, one or more sense components 150, or one or more input/output components 160, or any combination thereof may be located below the memory arrays 110 and, in some examples, may include transistors that are formed at least in part by doping portions of the substrate (e.g., substrate-based transistors, transistors having channels formed from doped crystalline silicon or other semiconductor). When scaling the memory device 100 with a greater quantity of decks or levels of memory arrays 110, the area of a substrate used for the supporting circuitry may increase, which may lead to scaling limitations (e.g., related to the limited area of a substrate to support circuitry for accessing a growing quantity of decks or levels of memory arrays 110 and, by extension, a growing quantity and area for such decoders or other supporting circuitry), among other challenges.

In accordance with examples as disclosed herein, a memory device 100 may include memory arrays 110 arranged in one or more stacks of decks formed over a substrate, and deck selection circuitry (e.g., deck selection transistors, deck decoding or addressing switches), or shunting circuitry (e.g., shunting transistors, equalization components), or a combination thereof may be distributed among the layers to leverage common substrate-based circuitry, such as logic or addressing circuitry, signal development circuitry, sensing circuitry, or other circuitry. For example, each memory array 110 of a stack may include a set of digit lines 130 of a corresponding deck, and deck selection circuitry, such as deck selection transistors or other switching circuitry (e.g., of the corresponding deck, of another deck) operable to couple the set of digit lines 130 with a column decoder or other circuitry that may be shared among (e.g., coupled with) multiple decks. In some examples, each memory array 110 of a stack may additionally or alternatively include shunting circuitry, such as shunting transistors or other switching circuitry (e.g., of the corresponding deck, of another deck) operable to couple the set of digit lines 130 with a plate node (e.g., an associated plate node, one or more associated plate lines 140), thereby equalizing a voltage across the memory cells 105 of the respective memory array 110.

In some examples, selection transistors such as deck selection or shunting transistors may include thin-film transistors that leverage thin-film manufacturing techniques (e.g., above a substrate), such as various techniques for forming vertical transistors (e.g., transistors having vertical channels, transistors having channels oriented at least in part along a thickness or height direction relative to a substrate), or transistors having channel portions formed at least in part by polycrystalline silicon or crystalline silicon formed above a substrate, among other techniques. Implementing such selection circuitry at various decks of such a memory device 100 may alleviate or mitigate area utilization challenges of a substrate level, such as moving some aspects of decoding or addressing into decks or levels above the substrate, or may support leveraging common logic signals or decoding circuitry, either or both of which may improve scaling in memory devices by supporting a greater quantity of decks for a given area of substrate-based circuitry. In some examples, selection transistors (e.g., deck selection transistors, shunting transistors) of or associated with a tile or memory cells may be activated by various configurations or one or more access lines, where the various configurations may be implemented to trade off or otherwise support design and performance characteristics such as power consumption, layout complexity, operational complexity, and other characteristics.

FIG. 2 illustrates an example of a transistor structure 200 that supports deck selection layouts in a memory device in accordance with examples as disclosed herein. The transistor structure 200 illustrates an example of a transistor that is formed at least in part by portions of a substrate 220 (e.g., doped portions 240 of the substrate 220), and may illustrate an arrangement of features for a transistor that is configured in a planar transistor arrangement. The substrate 220 may be a portion of a semiconductor chip, such as a silicon chip of a memory die (e.g., crystalline silicon, monocrystalline silicon). For illustrative purposes, aspects of the transistor structure 200 may be described with reference to an x-direction, a y-direction, and a z-direction (e.g., a height direction) of a coordinate system 210. In some examples, the z-direction may be illustrative of a direction perpendicular to a surface of the substrate 220 (e.g., a surface in an xy-plane, a surface upon or over which other materials may be deposited), and each of the structures, illustrated by their respective cross section in an xz-plane, may extend for some distance (e.g., length) along the y-direction.

The transistor structure 200 illustrates an example of a transistor channel, electrically coupled between a terminal 270-*a*-1 and a terminal 270-*a*-2, that may include one or more doped portions 240 of the substrate 220. In various examples, one of the terminals 270-*a*-1 or 270-*a*-2 may be referred to as a source terminal, and the other of the terminals 270-*a*-1 or 270-*a*-2 may be referred to as a drain terminal, where such designation or nomenclature may be based on a configuration or relative biasing of a circuit that includes the transistor structure 200. The channel or channel portion of a transistor may include or refer to one or more portions of the transistor structure that are operable to open or close a conductive path (e.g., to modulate a conductivity, to form a channel, to open a channel, to close a channel) between a source and drain (e.g., between the terminal 270-*a*-1 and the terminal 270-*a*-2) based at least in part on a voltage of a gate (e.g., a gate terminal, a gate portion 250).

In other words, a channel portion of a transistor structure may be configured to be activated, deactivated, made conductive, or made non-conductive, based at least in part on a voltage of a gate portion, such as gate portion 250. In some examples of transistor structure 200 (e.g., a planar transistor arrangement), the channel portion formed by one or more doped portions 240 of the substrate 220 may support a conductive path in a generally horizontal or in-plane direction (e.g., along the x-direction, within an xy-plane, in a direction within or parallel to a surface of the substrate 220).

In some examples, the gate portion 250 may be physically separated from the channel portion (e.g., separated from the substrate 220, separated from one or more of the doped portions 240) by a gate insulation portion 260 (e.g., a gate dielectric). Each of the terminals 270 may be in contact with or otherwise coupled with (e.g., electrically, physically) a respective doped portion 240-*a*, and each of the terminals 270 and the gate portion 250 may be formed from an electrically conductive material such as a metal or metal alloy, or a polycrystalline semiconductor (e.g., polysilicon), among other conductor or semiconductor arrangements formed above the substrate 220.

In some examples, the transistor structure 200 may be operable as an n-type or n-channel transistor, where applying a relatively positive voltage to the gate portion 250 that is above a threshold voltage (e.g., an applied voltage having a positive magnitude, relative to a source terminal, that is greater than a threshold voltage) activates the channel portion or otherwise enables a conductive path between the terminals 270-*a*-1 and 270-*a*-2 (e.g., along a direction generally aligned with the x-direction within the substrate 220). In some such examples, the doped portions 240-*a* may refer to portions having n-type doping or n-type semiconductor, and the doped portion 240-*b* may refer to a portion having p-type doping or p-type semiconductor (e.g., a channel portion having an NPN configuration along the x-direction or channel direction).

In some examples, the transistor structure 200 may be operable as a p-type or p-channel transistor, where applying a relatively negative voltage to the gate portion 250 that is above a threshold voltage (e.g., an applied voltage having a negative magnitude, relative to a source terminal, that is greater than a threshold voltage) activates the channel portion or otherwise enables a conductive path between the terminals 270-*a*-1 and 270-*a*-2. In some such examples, the doped portions 240-*a* may refer to portions having p-type doping or p-type semiconductor, and doped portion 240-*b* may refer to a portion having n-type doping or n-type semiconductor (e.g., a channel portion having a PNP configuration along the x-direction or channel direction).

In some examples, circuitry operable to support access operations on memory cells 105 (e.g., a row component 125, a column component 135, a plate component 145, a sense component 150, a memory controller 170, or various combinations thereof) may be formed to include respective sets of transistors each having the arrangement of the transistor structure 200, where each of the transistors may have a channel portion formed by respective doped portions 240 of a substrate 220. In some examples, such transistors may leverage a crystalline semiconductor material of the substrate 220 for various performance characteristics or manufacturing characteristics of such a material or an arrangement. Some examples of such an arrangement may be implemented in a complementary metal-oxide-semiconductor (CMOS) configuration, which may refer to various examples of a complementary and symmetrical pair of a p-type transistor and an n-type transistor (e.g., for logic functions). However, such structures or arrangements of substrate-based transistors may be limited by an available area of the substrate 220 (e.g., under a memory array 110 or stack of levels or decks of memory arrays 110).

In accordance with examples as disclosed herein, various aspects of a column component 135, among other circuitry (e.g., shunting circuitry, signal development circuitry), may be alternatively located away from (e.g., above) a substrate 220, including distributing various components or circuitry to levels or decks of a stack of memory arrays 110. For example, some circuitry, such as transistors that support aspects of decoding or addressing associated with the column component 135, or transistors that support aspects of voltage equalization between digit lines 130 and a plate node (e.g., plate lines 140) of a non-selected memory array 110, may be formed in one or more layers or levels above a substrate 220, where such transistors may include or be referred to as thin film transistors, or vertical transistors, among other configurations or terminology. In some examples, activation of such transistors may be associated with power consumption or latency, and various activation configurations may be implemented to trade off or otherwise support design and performance characteristics such as power consumption, layout complexity, operational complexity, and other characteristics.

Figure 3:
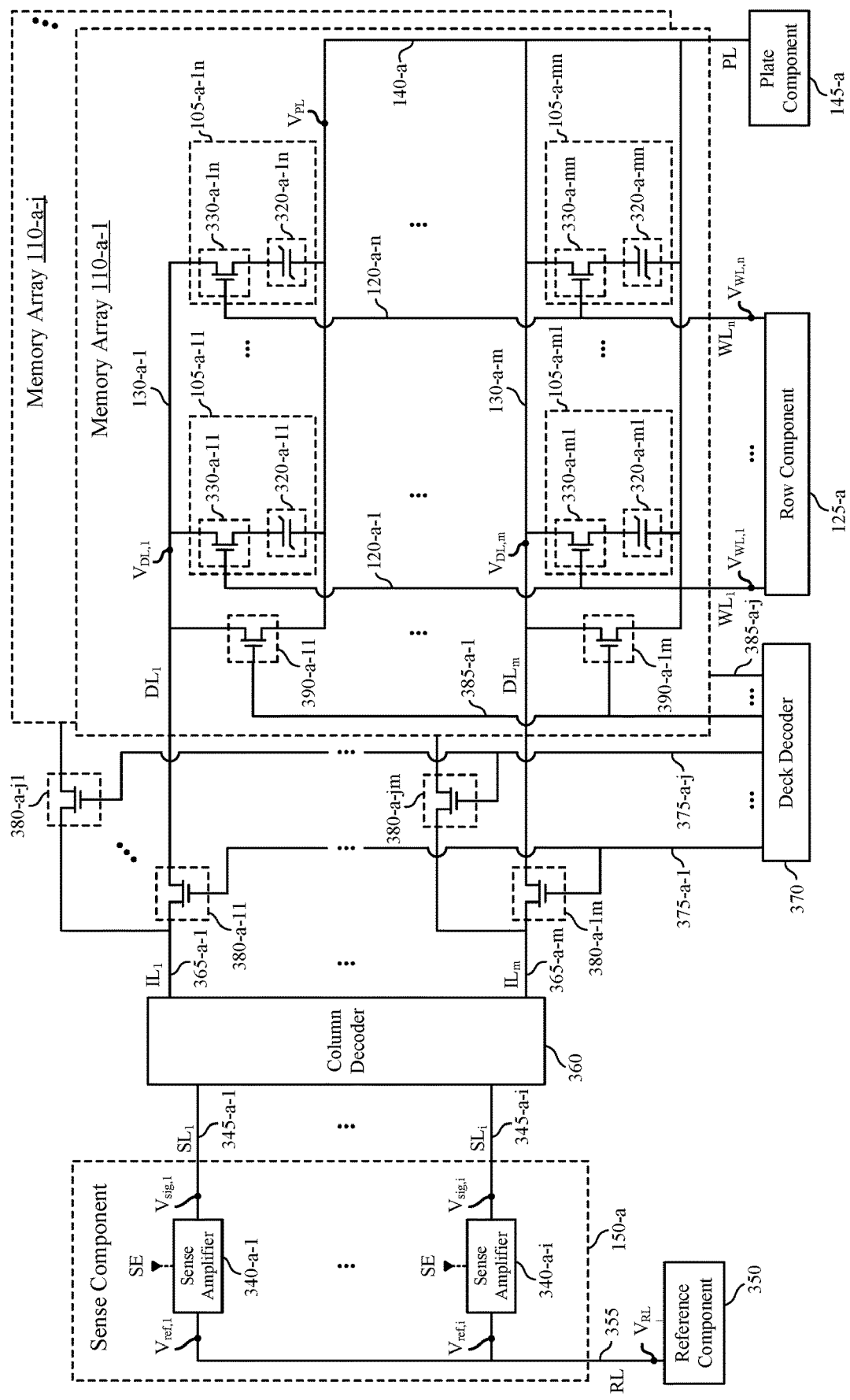
FIG. 3 illustrates an example of a circuit that supports deck selection layouts in a memory device in accordance with examples as disclosed herein.

FIG. 3 illustrates an example of a circuit 300 that supports deck selection layouts in a memory device in accordance with examples as disclosed herein. The circuit 300 may include a plurality of j memory arrays 110-a (e.g., memory arrays 110-a-1 through 110-a j), each of which may be associated with a deck (e.g., a level, a vertical position, a height) above a substrate of a memory die (e.g., a substrate 220). For the sake of illustrative clarity, components of a memory array 110-a are described with reference to a first memory array 110-a-1, but each of the memory arrays 110-a-1 through 110-a-j of the circuit 300 may be associated with respective components or functionality, that is similar, different, or some combination thereof.

The first memory array 110-a-1 may include a set of memory cells 105-a (e.g., memory cells 105-a-11 through 105-a-mn, a set of memory cells 105 associated with the first memory array 110-a-1), which may be arranged according to m columns and n rows. In the example of circuit 300, each of the memory cells 105-a includes a respective capacitor 320-a and a respective cell selection component 330-a (e.g., a cell selection transistor). In some examples, one or more of the capacitors 320-a may be ferroelectric capacitors operable to store a charge or polarization corresponding to a logic state (e.g., for ferroelectric memory cells 105-a, according to a ferroelectric memory architecture). A ferroelectric material used in a ferroelectric capacitor 320 may be characterized by an electric polarization where the material maintains a non-zero electric charge in the absence of an electric field. Electric polarization within a ferroelectric capacitor 320 results in a net charge at the surface of the ferroelectric material, and attracts opposite charge through the terminals of the ferroelectric capacitor 320. Thus, charge may be stored at the interface of the ferroelectric material and the capacitor terminals. In some examples, memory cells 105-a may include storage elements of different memory architectures, such as linear capacitors (e.g., in a DRAM application), transistors (e.g., in a NAND application, in an SRAM application), or material memory elements (e.g., chalcogenide storage elements, resistive storage elements, thresholding storage elements), among other types of storage elements.

Each of the memory cells 105-a may be coupled with a word line 120 (e.g., one of word lines 120-a-1 through 120-a-n), a digit line 130 (e.g., one of digit lines 130-a-1 through 130-a-m), and a plate line 140-a. In some illustrative examples, memory cells 105-a-11 through 105-a-1n may represent a set or column of memory cells 105 coupled with or between a digit line 130 (e.g., digit line 130-a-1) and the plate line 140-a (e.g., a plate node). In some illustrative examples, memory cells 105-a-11 through 105-a-m1 may represent a set or row of memory cells 105 coupled with a word line 120 (e.g., word line 120-a-1). Although the memory array 110-a-1 is illustrated as including a common plate line 140-a for all of the memory cells 105-a, some examples of a circuit 300 may include a separate plate lines 140 for each row of memory cells 105-a (e.g., an independently accessible plate line 140 associated with each of the word lines 120-a) or each subset of rows of memory cells 105-a, or separate plate lines 140 for each column of memory cells 105-a (e.g., an independently accessible plate line 140 associated with each of the digit lines 130-a) or each subset of columns of memory cells 105-a, among other configurations.

Each of the word lines 120-a (e.g., each of the word lines $WL_1$ through $WL_n$) may be associated with a respective word line voltage $V_{WL}$ as illustrated, and may be coupled with a row component 125-a (e.g., a row decoder). The row component 125-a may couple one or more of the word lines 120-a with various voltage sources (not shown). In some illustrative examples, the row component 125-a may selectively couple one or more of the word lines 120-a with a voltage source having a relatively high voltage (e.g., a selection voltage, which may be a voltage greater than 0V) or a voltage source having a relatively low voltage (e.g., a deselection voltage, which may be a ground voltage of 0V, or a negative voltage). Each of the digit lines 130-a (e.g., each of the digit lines $DL_1$ through $DL_m$) may be associated with a respective digit line voltage $V_{DL}$ as illustrated, and a memory cell 105-a, or capacitor 320-a or other storage element thereof, may be coupled with a digit line 130-a based at least in part on an activation or activation voltage of an associated word line 120-a.

In some examples, the row component 125-a may be shared among (e.g., coupled with, used for decoding, addressing, or accessing) the memory arrays 110-a-1 through 110-a-j. In various examples, an activation of a word line 120-a of the memory array 110-a-1 may or may not be accompanied by a corresponding activation of a word line 120 of one or more of the other memory arrays 110-a (e.g., activating a row in each of the memory arrays 110-a-1 through 110-a-j, activating a row in a subset of the memory arrays 110-a-1 through 110-a j). For example, each output terminal or node of the row component 125-a may be coupled with a respective word line 120 of one or more of the memory arrays 110-a-1 through 110-a j, or some subset thereof, which may include interconnections (e.g., vias, sockets, through-silicon vias (TSVs)) through the decks or levels of the memory device 100 or memory die that includes the circuit 300 to interconnect word lines 120 of the different decks or levels (e.g., of different ones of the memory arrays 110-a).

The plate line 140-a (e.g., plate line PL) may be associated with a plate line voltage $V_{PL}$ as illustrated, and may be coupled with a plate component 145-a (e.g., a plate decoder). The plate component 145-a may couple the plate line 140-a with various voltage sources (not shown). In one example, the plate component 145-a may selectively couple the plate line 140-a with a voltage source having a relatively high voltage (e.g., a plate high voltage, which may be a voltage greater than 0V) or a voltage source having a relatively low voltage (e.g., a plate low voltage, which may be a ground voltage of 0V, or a negative voltage).

In some examples, the plate component 145-a may be shared among (e.g., coupled with, used for decoding, addressing, or accessing) the memory arrays 110-a-1 through 110-a-j. In various examples, an activation of the plate line 140-a of the memory array 110-a-1 may or may not be accompanied by a corresponding activation of a plate line 140 of one or more of the other memory arrays 110-a (e.g., activating a common plate in each of the memory arrays 110-a-1 through 110-a j, activating a common plate in a subset of the memory arrays 110-a-1 through 110-a-j). For example, each output terminal or node of the plate component 145-a may be coupled with a respective plate line 140 of one or more of the memory arrays 110-a-1 through 110-a j, or some subset thereof, which may include interconnections (e.g., vias, sockets, TSVs) through the decks or levels of the memory device 100 or memory die that includes the circuit 300 to interconnect plate lines 140 of the different decks or levels. In some examples, one or more plate lines 140 of each of the memory arrays 110-a may be independently addressable, or may be otherwise biased independently from one another by the plate component 145-a.

The sense component 150-a may include various components for accessing (e.g., reading, writing) the memory cells 105 of the memory arrays 110-a-1 through 110-a-j. For example, the sense component 150-a may include a set of i sense amplifiers 340-a (e.g., sense amplifiers 340-a-1 through 340-a-i) each coupled between a respective signal line 345-a and a reference line 355. Each sense amplifier 340-a may include various transistors or amplifiers to detect, convert, or amplify a difference in signals, which may be referred to as latching. For example, a sense amplifier 340-a may include circuit elements that receive and compare a sense signal voltage (e.g., $V_{sig}$) of a respective signal line 345-a with a reference signal voltage (e.g., $V_{ref}$) of the reference line 355, which may be provided by a reference component 350. An output of a sense amplifier 340 may be driven to a higher (e.g., a positive) or a lower voltage (e.g., a negative voltage, a ground voltage) based on the comparison at the sense amplifier 340. To support such sensing, the circuit 300 may include various examples of signal development circuitry, such as voltage sources, switching components, capacitors (e.g., integrator capacitors, capacitors different than capacitors 320 of the memory cells 105-a), amplifiers (e.g., charge transfer sensing amplifiers, transistors operating in a cascode configuration, transistors operating in a voltage control or regulation configuration), or other circuitry, which may be distributed across various locations of the circuit 300 (e.g., within the sense component 150-a, between the sense component 150-a and the memory cells 105-a, coupled with intermediate lines 365-a or digit lines 130-a).

In some examples, electrical signals associated with such latching may be communicated between the sense component 150-a (e.g., sense amplifiers 340-a) and an input/output component 160, for example, via I/O lines (not shown). In some examples, the sense component 150-a may be in electronic communication with a memory controller (not shown), such as a memory controller 170 described with reference to FIG. 1, which may control various operations of the sense component 150-a. In some examples, activating a logical signal SE may be referred to as "enabling" or "activating" the sense component 150-a or sense amplifiers 340-a thereof. In some examples, activating logical signal SE may be referred to, or be part of an operation known as "latching" the result of accessing memory cells 105.

The circuit 300 may implement various techniques for multiplexing the digit lines 130 with the sense amplifiers 340-a to support accessing the memory cells 105-a. For example, a quantity of sense amplifiers 340-a of the sense component 150-a may be less than a quantity of digit lines 130 among the memory arrays 110-a-1 through 110-a-j, and certain ones of the digit lines 130 of the memory arrays 110-a-1 through 110-a-j may be coupled with certain ones of the sense amplifiers 340-a over a given duration for a performing an access operation. In accordance with examples as disclosed herein, the circuit 300 may support such multiplexing using a combination of a column decoder 360 and a deck decoder 370, which may refer to a distribution or separation of components or functionality of a column component 135 described with reference to FIG. 1.

The column decoder 360 may be configured to support multiplexing or coupling between the i sense amplifiers 340-a or i signal lines 345-a (e.g., signal lines 345-a-1 through 345-a-i, $SL_1$ through $SL_i$) and m intermediate lines 365 (e.g., intermediate lines 365-a-1 through 365-a-m, $IL_1$ through $IL_m$). In some examples, m may be greater than i, such as m being an integer multiple of i. In some examples, m may be equal to a quantity of digit lines 130 or columns in each of the memory arrays 110-a-1 through 110-a-j.

The deck decoder 370 may be operable to select from among the memory arrays 110-a, which may include a selective coupling or isolation via respective transistors 380-a (e.g., deck selection transistors) between intermediate lines 365-a and digit lines 130-a of one or more selected memory arrays 110-a. In the example of circuit 300, each memory array 110-a may be associated with a respective row of transistors 380-a, which may be activated using a respective deck selection line 375-a. For example, memory array 110-a-1 may be associated with transistors 380-a-11 through 380-a-1m and a deck selection line 375-a-1, memory array 110-a-j may be associated with transistors 380-a-j1 through 380-a-jm and a deck selection line 375-a-j, and so on. In some examples, a quantity of memory arrays 110-a and deck selection lines 375-a (e.g., a quantity j) may be equal to a quantity of decks or levels of the circuit 300 (e.g., of a memory device 100 or a memory die that includes the circuit 300). In some examples (e.g., when multiple memory arrays 110-a are located on a same deck or level), a quantity of memory arrays 110-a and deck selection lines 375-a may be greater than a quantity of decks or levels (e.g., an integer multiple of decks or levels).

In some examples, when an access operation is to be performed on memory cells 105-a of the memory array 110-a-1, the deck decoder 370 may activate the deck selection line 375-a-1. Activating the deck selection line 375-a-1 may activate each of the transistors 380-a-11 through 380-a-1m, thereby coupling the digit lines 130-a-1 through 130-a-m with the column decoder 360 (e.g., via intermediate lines 365-a-1 through 365-a-m). The column decoder 360 may be accordingly operable for coupling one or more of the digit lines 130-a-1 through 130-a-m of the selected memory array 110-a-1 with the sense amplifiers 340-a-1 through 340-a-i to support various access operations (e.g., read operations, write operations).

In some examples, when an access operation is to be performed on memory cells 105-a of the memory array 110-a-1, the deck decoder 370 may deactivate other deck selection lines 375 (e.g., deck selection line 375-a-j, among others), which may deactivate each of the other transistors 380 (e.g., transistors 380-a-j1 through 380-a-jm, among others), thereby decoupling the digit lines 130 of the other memory arrays 110-*a* from the column decoder 360 (e.g., from intermediate lines 365-*a*-1 through 365-*a*-*m*). In some examples, such an isolation may improve read margins, power consumption, or other operation of the circuit 300, due to reduced intrinsic capacitance from the perspective of the sense amplifiers 340-*a*, or reduced charge leakage or dissipation (e.g., via unselected memory arrays 110-*a*), among other phenomena. Moreover, such isolation may support simplified row decoding (e.g., when word lines 120 of different memory arrays 110-*a* are coupled with a same or common output of the row component 125-*a*), since rows of multiple memory arrays 110-*a* may be activated while only the digit lines 130 of certain selected memory arrays 110-*a* may be coupled with circuitry supporting a given access operation.

In some examples, the deck decoder 370 and the transistors 380 may be operable to support aspects of both decoding functionality and signal development functionality (e.g., for developing read signals from accessing memory cells 105-*a*). For example, in a first operating condition, the deck decoder 370 may bias a deck selection line 375-*a* with a first voltage (e.g., a deselection voltage), which may be associated with an isolation of the respective digit lines 130-*a* from the intermediate lines 365-*a* (e.g., operating transistors 380-*a* in an "open" or open circuit mode, in a digital switching mode). In some examples, such operations may be associated with deselecting a memory array 110-*a* (e.g., deselecting a deck), which may support performing an access operation on another memory array 110-*a* that is selected, or other examples where the memory device is not performing access operations. In some examples, the first voltage may be associated with a ground voltage, or another voltage associated with a logic 0 or a deactivation in digital signaling or other logical or switching operations of a memory device 100. In some examples, the first voltage may be a negative voltage, which may be associated with a reduced leakage across transistors 380 (e.g., compared with a ground or zero gate voltage at transistors 380).

In a second operating condition, the deck decoder 370 may bias a deck selection line 375-*a* with a second voltage (e.g., a signal development voltage), which may be associated with at least a temporary coupling between the respective digit lines 130-*a* and intermediate lines 365-*a*, including such a coupling in a subthreshold mode of the transistors 380 (e.g., in a signal development mode, in an analog cascode or voltage control mode). In some examples, such operations may be associated with selecting a memory array 110-*a* (e.g., to perform read operations on the digit lines 130-*a*). In some examples, the second operating condition may support read signal development (e.g., at intermediate lines 365-*a*, at signal lines 345-*a*) that is based at least in part on states stored at respective memory cells 105 and a magnitude of the second voltage. In the second operating condition, the transistors 380 may operate as or be otherwise referred to as a cascode, a voltage controller, a voltage regulator, or a charge transfer sensing amplifier, relating to how the transistor 380 may regulate a flow of charge in response to a change in voltage across the transistor 380 (e.g., between a source node of the transistor 380 and the gate node of the transistor 380). For example, biasing the gate of the transistor 380 with the second voltage may throttle or otherwise control a flow of charge (e.g., electrical current) between the respective digit line 130-*a* and the respective intermediate line 365-*a*. In some examples, the second voltage may be configurable based on various conditions of a memory device 100. For example, the deck decoder 370 may be operable to generate the second voltage based on a voltage level provided to or by the memory device 100 (e.g., a power supply voltage, a regulated voltage), a temperature of the memory device 100, or a combination thereof, which may support adapting operations of the signal development to various process, voltage, or temperature variability between memory devices 100.

In a third operating condition, the deck decoder 370 may bias a deck selection line 375-*a* with a third voltage (e.g., a selection voltage), which may be associated with coupling of the respective digit lines 130-*a* with the intermediate lines 365-*a* (e.g., in a "closed" or closed circuit mode, in a digital switching mode), which may include such a coupling in a saturation mode of the transistors 380-*a*. In some examples, such operations may be associated with selecting a memory array 110-*a* (e.g., selecting a deck), such as to perform write operations on the respective digit lines 130-*b*. In some examples, the third voltage may have a level associated with a logic 1 or an activation in digital signaling or other logical or switching operations of a memory device 100. In some examples, the third voltage may be a relatively large voltage (e.g., greater than the second voltage) that modulates the conductivity of the channel of the transistor 380 to a relatively high value (e.g., a low resistivity). Such a condition may support relatively low impedance or low latency for some aspects of access operations (e.g., during a write operation).

In some examples, the circuit 300 may include one or more capacitors (e.g., integrator capacitors, not shown), which may support a cascode or charge transfer sensing amplification functionality of the transistors 380-*a*. In some examples, each of the intermediate lines 365-*a* may be associated with a respective capacitor, which may be associated with a quantity of capacitors in the circuit 300 being equal to a quantity of columns of memory cells 105-*a* in each memory array 110-*a*. In some other examples, each of the signal lines 345-*a* may be associated with a respective capacitor, which may be associated with a quantity of capacitors in the circuit being equal to a quantity of sense amplifiers 340-*a* in the sense component 150-*a*.

In some examples, the deck decoder 370 or some other decoder circuitry also may be operable to support shunting of the memory arrays 110-*a*, which may include a coupling of or between digit lines 130-*a* of a memory array 110-*a* and one or more plate lines 140-*a* of the memory array 110-*a* (e.g., a direct connection, a shorting). Such shunting may equalize a voltage between the digit lines 130-*a* and the one or more plate lines 140-*a* of the memory array 110-*a*, which may equalize a voltage across the memory cells 105 of the memory array 110-*a* (e.g., equalizing a voltage across capacitors 320 when a corresponding cell selection component 330 is activated during a shunting or equalization operation). A voltage equalization across memory cells 105 that are not targeted for an access operation may support preventing or mitigating voltage disturbances that may affect stored polarization at respective memory cells 105, among other purposes.

In some examples, shunting functionality may include a selective coupling or an isolation via respective transistors 390-*a* (e.g., shunting transistors) between digit lines 130-*a* and plate lines 140-*a* of one or more non-selected memory arrays 110-*a* (e.g., one or more memory arrays 110-*a* that are not selected for an access operation). In the example of circuit 300, each memory array 110-*a* may be associated with a respective row of transistors 390-*a*, which may be activated using a respective deck shunting line 385-*a*. For example, memory array 110-*a*-1 may be associated with transistors 390-*a*-11 through 390-*a*-1*m* and a deck shunting line 385-*a*-1, memory array 110-*a*-*j* may be associated with transistors 390-*a*-j1 through 390-*a*-*jm* (not shown) and a deck shunting line 385-*a*-*j*, and so on. In various examples, a quantity of deck shunting lines 385-*a* (e.g., a quantity j) may be equal to or greater than a quantity of decks or levels of the circuit 300.

In some examples, when an access operation is to be performed on memory cells 105 of the memory array 110-*a*-*j* (e.g., a selected or targeted memory array 110-*a*), the deck decoder 370 may activate the deck shunting line 385-*a*-1, among others (e.g., each of the deck shunting lines 385-*a*-1 through 385-*a*-(j−1), which may correspond to memory arrays 110-*a* that are also decoupled from the column decoder 360 via respective transistors 380-*a*). Activating the deck shunting line 385-*a*-1 may, in some examples, activate each of the transistors 390-*a*-11 through 390-*a*-1*m*, thereby coupling the digit lines 130-*a*-1 through 130-*a*-*m* with the plate line 140-*a*. Further, the deck decoder may deactivate the deck shunting line 385-*a*-*j*, which may deactivate each of the transistors 390-*a*-j1 through 390-*a*-*jm* of the memory array 110-*a* j, thereby opening or disconnecting a direct connection between digit lines 130-*j*-1 through 130-*j*-*m* from a plate line 140-*j* (not shown) of the memory array 110-*a*-*j*. In some examples, when the circuit 300 is operating in an idle or standby condition, each of the deck shunting lines 385-*a*-1 through 385-*a*-*j* may be activated.

In some examples, the deck decoder 370 may operate deck selection lines and deck shunting lines using common logic signals, among other techniques for coordinated activation and deactivation. For example, an activation of the deck selection line 375-*a*-1 may be associated with a deactivation of the deck shunting line 385-*a*-1, or a deactivation of the deck selection line 375-*a*-1 may be associated with an activation of the deck shunting line 385-*a*-1, or both. In some examples, such techniques may be based on a common logic signal for a memory array 110-*a*, where an activation of such a common logic signal for the memory array 110-*a*-1 may be associated with both the activation of the deck selection line 375-*a*-1 and the deactivation of the deck shunting line 385-*a*-1, and vice versa. In some examples, a common logic signal may be applied to gates of each of the transistors 380 and 390 (e.g., when the transistors 380 are associated with a different channel type than the transistors 390). In some other examples, a common logic signal may be applied to the gates of either the transistors 380 or the transistors 390, and an inversion may be applied to the common logic signal before being applied to the gates of the other of the transistors 380 or 390 (e.g., when the transistors 380 and 390 are associated with the same channel type). In some examples, activation of either the transistors 380 or 390 may be delayed relative to deactivation of the other of the transistors 380 or 390, which may reduce or eliminate a duration over which both the transistors 380 and the transistors 390 are in a conductive state, which may reduce power consumption, charge leakage, or signal interference, among other benefits. Although the example of circuit 300 includes transistors 390, various examples of circuitry and techniques in accordance with examples as disclosed herein may or may not implement transistors 390, or may implement shunting or cell equalization in accordance with other techniques.

The configuration of components in the circuit 300 may support improved flexibility for layout or formation of a memory device 100 or memory die that includes the circuit 300. For example, the row component 125-*a*, the plate component 145-*a*, the sense component 150-*a*, the reference component 350, or the column decoder 360, or various combinations thereof, may be formed at least in part by circuitry that is below the memory arrays 110-*a*, or on another deck or level than the memory arrays 110-*a*. In some examples, such circuitry may be formed at least in part on a substrate (e.g., a substrate 220, a crystalline semiconductor substrate or portion), and may include various configurations of substrate-based transistors (e.g., in accordance with the transistor structure 200, including one or more sets of transistors in a CMOS configuration).

In accordance with examples as disclosed herein, transistors 380 and transistors 390 may be located above a substrate, including various locations among the decks or levels of the memory arrays 110 (e.g., distributed among one or more decks or levels of a plurality of decks or levels above the substrate). For example, the transistors 380 and 390 may be formed using thin film fabrication techniques, such as including respective channel portions formed from polycrystalline semiconductor material or crystalline semiconductor material (e.g., deposited over a substrate 220). In some examples, the transistors 380 and 390 may be formed as vertical transistors (e.g., transistors having a channel portion that is aligned in a height direction relative to a substrate 220), including various configurations that leverage one or more pillars of channel material having a conductivity that may be modulated based on a voltage of a respective gate portion. In some examples, memory cells 105 of a memory die may be arranged in a plurality of tiles over a substrate 220, where various configurations of transistors 380, deck selection lines 375, transistors 390, or deck shunting lines 385 may be implemented for one or more tiles of memory cells 105 to trade off or otherwise support design and performance characteristics such as power consumption, layout complexity, operational complexity, and other characteristics may be achieved, among other benefits.

Figure 4:
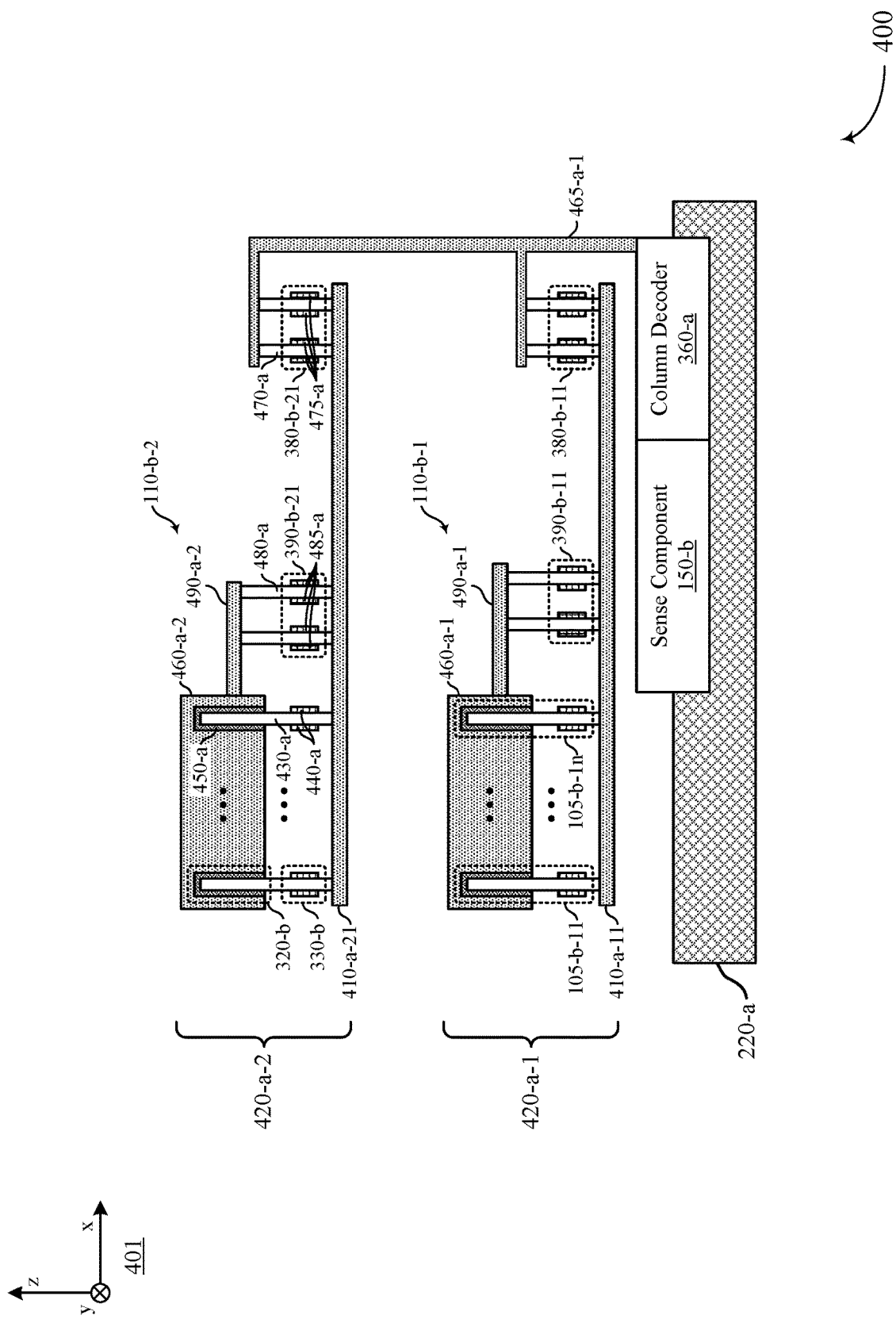
FIGS. 4 and 5 illustrate examples of memory structures that support deck selection layouts in a memory device in accordance with examples as disclosed herein.

FIG. 4 illustrates an example of a memory structure 400 that supports deck selection layouts in a memory device in accordance with examples as disclosed herein. The memory structure 400 may be illustrative of portions of a memory device 100 or memory die that may be formed with or over a substrate 220-*a*, which may be an example of a substrate 220 described with reference to FIG. 2. The memory structure 400 may illustrate examples for implementing aspects of the circuit 300 described with reference to FIG. 3. For illustrative purposes, aspects of the memory structure 400 may be described with reference to an x-direction, a y-direction, and a z-direction of a coordinate system 401. The z-direction may be illustrative of a direction perpendicular to a surface of the substrate 220-*a* (e.g., a surface in an xy-plane, a surface upon or over which other materials may be deposited), and each of the related structures, illustrated by their respective cross section in an xz-plane, may extend for some distance, or be repeated for some quantity (e.g., according to a pitch dimension), or both along the y-direction. In some examples, for illustrative purposes, the x-direction may be aligned with or referred to as a column direction (e.g., along a column of memory cells), and the y-direction may be aligned with or referred to as a row direction (e.g., along a row of memory cells 105).

The memory structure 400 illustrates an example of memory arrays 110 associated with different levels 420 (e.g., different decks, a stack of decks, a stack of levels). For example, the memory array 110-*b*-1 may be associated with a level 420-*a*-1 at a first height or position relative to the substrate 220-*a*, and the memory array 110-*b*-2 may be associated with a level 420-*a*-2 at a second (e.g., different) height or position relative to the substrate 220-*a* (e.g., above the level 420-a-1, relative to the substrate 220-a). Although the memory structure 400 illustrates an example with two levels 420-a, techniques described herein may be applied in a memory structure having any quantity of one or more levels 420.

At least some, if not each of the memory arrays 110-b may include a respective set of memory cells 105-b arranged or addressed according to rows (e.g., aligned along the y-direction, addressed according to a position along the x-direction) and columns (e.g., aligned along the x-direction, addressed according to a position along the y-direction). For example, a column of the memory array 110-b-1 may include n memory cells 105-b-11 through 105-b-1n, and may be associated with (e.g., formed upon, formed in contact with, coupled with) a digit line conductor 410-a-11 (e.g., an example of a digit line 130). In some examples, a column of the memory array 110-b-2 may include a same quantity of memory cells 105-b, which may or may not be physically aligned (e.g., along the z-direction) or overlapping (e.g., when viewed in an xy-plane) with the memory cells 105-b of the memory array 110-b-1. A quantity of columns, m, may be formed by repeating the illustrated memory cells 105 and digit line conductors 410-a, among other features, along the y-direction.

At least some, if not each of the memory cells 105-b in the memory structure 400 may include a respective capacitor 320-b and a respective cell selection component 330-b (e.g., a transistor). In the example of memory structure 400, each of the cell selection components 330-b may be formed as a vertical transistor, which may include a channel portion (e.g., a vertical channel) formed at least in part by a respective pillar 430-a, or portion thereof (e.g., along the z-direction), and a gate portion formed at least in part by a respective word line conductor 440-a (e.g., an example of a word line 120). In some examples, the gate portion of a cell selection component 330-b may be a portion or a region of a word line 120 or word line conductor 440-a that is operable to activate the channel portion (e.g., to modulate a conductivity of the channel portion) of the cell selection component 330-b. The word line conductors 440-a may extend from one memory cell 105-b to another memory cell 105-b along a direction, such as the y-direction (e.g., a row direction, along a row of memory cells 105-b), and may be coupled with a row component 125 (not shown) for selecting or activating a row of memory cells 105-b (e.g., by biasing the word line conductors 440-a).

In some examples, word line conductors 440-a of one memory array 110-b (e.g., memory array 110-b-1) may be coupled or connected with word line conductors 440-a of another memory array 110-b (e.g., memory array 110-b-2), such that rows of memory cells 105-b may be commonly activated across multiple memory arrays 110-b or multiple levels 420-a (e.g., by a common node or output of a shared row component 125, not shown). In some examples, interconnections between word line conductors 440-a of different levels 420-a may be formed at least in part along the z-direction by one or more vias, sockets, or TSVs, which may be located at or near a boundary of the memory arrays 110-b (e.g., along the y-direction), among other locations relative to the memory arrays 110-b.

Each capacitor 320-b for a memory cell 105-b may include a respective dielectric portion 450-a formed between a pillar 430-a, or some portion otherwise aligned with a pillar (e.g., a portion aligned along the z-direction, an inner portion of the capacitor 320-b), associated with the memory cell 105-b and a plate conductor 460-a (e.g., an example of a plate line 140, a plate node, or a common plate, an outer portion of the capacitor 320-b). For example, each capacitor 320-b may include a respective inner portion aligned along the z-direction with or otherwise coincident with a pillar 430-a, and a respective outer portion (e.g., at least partially concentric around the inner portion) that is separated from the inner portion by a respective dielectric portion 450-a. In some examples, the outer portions of two or more capacitors 320-b may be a contiguous material, such as a contiguous metal or other conductor of a plate line or common plate node (e.g., of a plate conductor 460-a). In some examples, a portion of a pillar 430-a of a capacitor 320-b may be a same material or combination of materials as a portion of the pillar 430-a of a corresponding cell selection component 330-b (e.g., a doped semiconductor material, a polycrystalline semiconductor). In some examples, a portion of a pillar 430-a of capacitor 320-b may be or include a different material or combination of materials as a portion of the pillar 430-a of a corresponding cell selection component 330-b (e.g., a metal or conductor portion, a metal layer deposited on or over a surface of the pillar 430-a). In some examples, the dielectric portions 450-a may be formed with a ferroelectric material operable to maintain a non-zero electric charge or polarization (e.g., corresponding to a stored logic state) in the absence of an electric field.

In the example of memory structure 400, the memory array 110-b-1 may be associated with (e.g., coupled with, include, be accessed using) a plate conductor 460-a-1 and the memory array 110-b-2 may be associated with a plate conductor 460-a-2. Each of the plate conductors 460-a may be coupled with a plate component 145 (not shown) for biasing the plate conductors 460-a. In the example of memory structure 400, each plate conductor 460-a may be associated with at least a column of memory cells 105-b. In some examples, each of the plate conductors 460-a may also extend along the y-direction along a row of memory cells 105-b, or some portion thereof, in which case each of the plate conductors 460-a may be associated with all of the memory cells 105-b of a respective memory array 110-b, or some subset of columns of the respective memory array 110-b. In some examples, a plate conductor 460-a may be a metal or other conductor formed over or between the dielectric portions 450-a of the memory cells 105-b of the respective memory array 110-b.

In the example of memory structure 400, each column of memory cells 105-b of each memory array 110-b may be associated with a respective transistor 380-b (e.g., a deck selection transistor), which may also be formed as a vertical transistor. Each transistor 380-b may be operable to couple a respective digit line conductor 410-a with an intermediate line conductor 465-a (e.g., an example of an intermediate line 365). In the example of memory structure 400, each intermediate line conductor 465-a may be a combination of horizontal metal layers formed in contact with (e.g., above, opposite the digit line conductors 410-a) pillars 470-a and a vertical portion coupled with the column decoder 360-a that may be formed by one or more vias, sockets, or TSVs. In the example of memory structure 400, to support m columns per memory array 110-b, m intermediate line conductors 465-a may be formed along the y-direction, and each intermediate line conductor 465-a may be coupled or connected with a transistor 380-b of each memory array 110-b or each level 420-a (e.g., intermediate line conductor 465-a-1 being coupled with transistors 380-b-11 and 380-b-21).

At least some, if not each, transistor 380-b may include a channel portion (e.g., a vertical channel) formed at least in part by one or more respective pillars 470-a and a gate portion formed at least in part by one or more respective deck selection conductors 475-*a* (e.g., an example of a deck selection line 375). In some examples, the gate portion of a transistor 380-*b* may be a portion or a region of a deck selection line 375 that is operable to activate the channel portion (e.g., to modulate a conductivity of the channel portion) of the transistor 380-*b*. The deck selection conductors 475-*a* may extend from one column of memory cells 105-*b* to another, or from one transistor 380-*b* to another, along a direction, such as the y-direction (e.g., along a row direction, parallel with rows of memory cells 105), and may be coupled with a deck decoder 370 (not shown) for selecting or activating a memory array 110-*b* (e.g., by biasing the deck selection conductors 475-*a*, by activating a row or other set of transistors 380-*b*).

The set of m intermediate line conductors 465-*a* may be coupled with a column decoder 360-*a*, which may, in turn, be coupled with a sense component 150-*b* (e.g., via a plurality of signal lines 345). Accordingly, a combination of a deck decoder 370 (not shown) and the column decoder 360-*a*, may be used to multiplex, address, or otherwise selectively couple the digit line conductors 410-*a* of the memory arrays 110-*b*-*a* and 110-*b*-2 with the sense component 150-*b*, or sense amplifiers 340 thereof, to support various access operations.

In the example of memory structure 400, each column of memory cells 105-*b* of each memory array 110-*b* may also be associated with a respective transistor 390-*b* (e.g., a shunting transistor), which also may be formed as a vertical transistor. Each transistor 390-*b* may be operable to couple a respective digit line conductor 410-*a* with a conductor portion 490-*a* (e.g., a conductor portion 490-*a* respective to the digit line conductor 410-*a*, a conductor portion 490-*a* common to the digit line conductors 410-*a* of a memory array 110-*b*, a plate connection), which may connect or shunt the respective digit line conductor 410-*a* with a plate conductor 460-*a*.

At least some, if not each, transistor 390-*b* may include a channel portion (e.g., a vertical channel) formed at least in part by one or more respective pillars 480-*a* and a gate portion formed at least in part by one or more respective shunt selection conductors 485-*a* (e.g., an example of a deck shunting line 385). In some examples, the gate portion of a transistor 390-*b* may be a portion or a region of a deck shunting line 385 that is operable to activate the channel portion (e.g., to modulate a conductivity of the channel portion) of the transistor 390-*b*. The shunt selection conductors 485-*a* may extend from one column of memory cells 105-*b* to another, or from one transistor 390-*b* to another, along a direction, such as the y-direction (e.g., along a row direction, parallel with rows of memory cells 105), and may be coupled with a deck decoder 370 (not shown) for shunting a memory array 110-*b* (e.g., by biasing the shunt selection conductors 485-*a*, by activating a row of transistors 390-*b*).

The conductor portions 490-*a*, or the functionality thereof, may be provided by various types of structures. In the example of memory structure 400, each of the conductor portions 490-*a* may include a horizontal conductor portion (e.g., metal layer, a portion aligned along at least the x-direction) formed in contact with (e.g., above, opposite the digit line conductors 410-*a*) one or more pillars 480-*a*, and in contact with one or more plate conductors 460-*a*. In various examples, the conductor portions 490-*a* may be formed using one or more common processes or materials as the formation of intermediate line conductors 465-*a*, or the formation of plate conductors 460-*a*, or both. In some examples, a conductor portion 490-*a* may include multiple horizontal conductor portions, one or more vertical conductor portions (e.g., sockets, vias), or any combination thereof.

In some examples, the functionality of the conductor portions 490 may be provided by "shorted" or dummy cells or capacitors (not shown). For example, a conductor portion 490 may include a portion aligned and in contact with one or more pillars 480, or a material portion or extension of a pillar 480, which may have a similar material, similar dimension, or other aspects similar to an inner portion of a capacitor 320. Additionally or alternatively, a conductor portion 490 may include a portion having a similar material, similar dimension, or other aspects similar to an outer portion of a capacitor 320. In such cases, the conductor portions 490-*a* may be formed with one or processes that are also used for forming capacitors 320, but may omit a dielectric portion 450. Although the example of memory structure 400 includes shunting functionality by way of transistors 390-*b*, in some examples, shunting functionality may be omitted (e.g., omitting transistors 390-*b* and conductor portions 490), or may be supported by other techniques.

In various examples, each of the pillars 430, 470, and 480 may be operable to support at least a portion of a channel of a respective transistor (e.g., a channel or operable conductive path aligned along the z-direction, supporting an electrical coupling or conductive path between source and drain terminals based at least in part on a voltage of a respective gate portion, gate terminal, or gate conductor), and may include one or more doped semiconductor portions. For example, to support an n-type transistor, a pillar 430, a pillar 470, or a pillar 480 may include at least a p-type semiconductor portion, or may include a stack (e.g., in the z-direction) of an n-type semiconductor, a p-type semiconductor, and an n-type semiconductor (e.g., in an NPN arrangement along the z-direction), among other constituent materials or arrangements. To support a p-type transistor, a pillar 430, a pillar 470, or a pillar 480 may include at least an n-type semiconductor portion, or may include a stack (e.g., along the z-direction) of a p-type semiconductor, an n-type semiconductor, and a p-type semiconductor (e.g., in an PNP arrangement in the z-direction), among other constituent materials or arrangements. In some examples, a pillar as described herein (e.g., a pillar 430, a pillar 470, a pillar 480) may include one or more electrodes or electrode portions, such as an electrode at one or both ends of the pillar (e.g., a top end, a bottom end, or both).

Each of the pillars 430, 470, and 480 may be associated with a height or a height dimension relative to the substrate (e.g., a lower extent in the z-direction, an upper extent in the z-direction, a span in the z-direction), which may be defined as part of balancing various performance criteria of the memory arrays 110. In some examples, a height dimension or extent in the z-direction of the pillars 430 and the pillars 470, or the pillars 430 and the pillars 480, or the pillars 470 and the pillars 480, or the pillars 430, 470, and 480, may be the same as or at least partially overlapping with a height dimension or extent in the z-direction. For example, various combinations of the pillars 430, 470, and 480 may have a common height dimension (e.g., a common upper extent, a common lower extent, or both) relative to the substrate. In some examples, the pillars 430 may have a height or a height dimension that is different than the pillars 470, or the pillars 480, or both, such as the pillars 430 having an extended height along the z-direction to support one or more features of the capacitors 320. The pillars 430, 470, and 480 may be formed with various cross-sectional shapes (e.g., in an xy-plane), such as a square shape, a rectangular shape, a circular shape, an oval shape, or a polygonal shape, among others, where pillars 430, 470, and 480 may have common or different shapes, or common or different dimensions.

The pillars 430, 470, and 480 may be formed according to various techniques. In some examples, one or more layers or stacks of layers of doped semiconductor material may be deposited on or above a substrate (e.g., on or in contact with a digit line conductor 410, or corresponding metal layer), and portions of the deposited layers located between respective pillars 430, 470, and 480 (e.g., along the x-direction, along the y-direction) may be etched away or trenched to form the respective pillars. In some examples, pillars 430, 470, and 480 may be formed from the same material or combination of materials (e.g., from a same layer or stack of layers, to support a common type of transistor channel). In some examples, such layers may include one or more electrode layers, such as an electrode layer above a stack of doped semiconductor material layers, an electrode layer below a stack of doped semiconductor material layers, or both, and such electrode layers may be or may not be etched or trenched along with the pillar formation processes. Additionally or alternatively, in some examples, holes or trenches may be etched through a material (e.g., in the z-direction, through a dielectric material, through a gate dielectric material) and material for the pillars 430, 470, or 480 (e.g., one or more doped semiconductor materials, one or more electrode materials) may be deposited in the etched holes or trenches. In examples where pillar material is deposited into holes, trenches, or other recesses, pillars 430, 470, and 480 may or may not be formed from a same material or combination of materials.

In various examples, a quantity or configuration of pillars 430, 470, and 480 for a respective transistor may be defined or chosen for particular characteristics, such as an associated drive strength (e.g., drive current), impedance, activation threshold, or leakage characteristic of a particular transistor or set of transistors. In some examples, multiple pillars 430, multiple pillars 470, or multiple pillars 480 may be described as or configured as parallel physical structures (e.g., parallel channels) of a common transistor or transistor component. For example, as illustrated, each of the transistors 380-b may include or be otherwise formed with two pillars 470-a, and each of the transistors 390-b may include or be otherwise formed with two pillars 480-a. However, in other examples, a transistor 380, a transistor 390, or a cell selection component 330 may include or be otherwise formed with any quantity of one or more pillars 470, 480, or 430, respectively. Likewise, in various examples, a capacitor 320 may be formed with or over any quantity of one or more pillars 430. In some examples, each pillar 430, 470, or 480 of a set that is configured in parallel (e.g., commonly activated) may be described as or configured as a component of single transistor, such that a corresponding cell selection, deck selection, or deck shunting may be described as or configured as having multiple transistors in a parallel arrangement.

In some examples, various combinations of word line conductors 440, deck selection conductors 475, and shunt selection conductors 485 of a given memory array 110 may be formed using one or more common operations, one or more common materials, or otherwise share various aspects of formation or configuration. For example, word line conductors 440, deck selection conductors 475, and shunt selection conductors 485 may be formed using one or more common conductor formation processes (e.g., a common masking process, a common etching process, a common deposition process, or various combinations thereof). In some examples, word line conductors 440, deck selection conductors 475, and shunt selection conductors 485 may be formed with a height dimension that is within or overlapping with a height dimension of at least doped semiconductor portions of the pillars 430, 470, and 480 (e.g., respectively, supporting the function of modulating a conductivity through channel portions of the cell selection components 330, transistors 380, and transistors 390 respectively).

In various examples, word line conductors 440, deck selection conductors 475, or shunt selection conductors 485 may be formed from a metal or metal alloy (e.g., copper, tungsten, gold, silver, tin, aluminum, or alloys thereof). Such conductors may be separated from pillars 430, 470, or 480 (along the x-direction, along the y-direction, along the x-direction and the y-direction, along a radial direction) by a gate dielectric that is in contact with portions of the conductor and the respective pillar. In some examples, gate conductors may be located alongside the respective pillars (e.g., as a transverse gate, as a pass-by gate, as a pair of gate conductors on either or both sides of a pillar), including conductors extending between the pillars along the y-direction and separated from pillars along the x-direction by a gate dielectric. In some examples, gate conductors may include at least a portion that wraps (e.g., partially, entirely) around respective pillars (e.g., as a wrap-around gate, as a circumferential gate, as a concentric gate, as an all-around gate), where at least the respective pillars may be wrapped (e.g., partially wrapped, entirely wrapped) with a circumferential gate dielectric that is in contact with the pillar and the conductor. In various examples, the digit line conductors 410 or intermediate line conductors 465, among other components such as conductors, may be formed from a metal or metal alloy, which may be a same material or a different material as conductors used to support transistor gate portions (e.g., word line conductors 440, deck selection conductors 475, shunt selection conductors 485).

In some examples, circuitry of a deck decoder 370 (not shown), the column decoder 360-a, or the sense component 150-b, or any combination thereof may be substrate-based, such as including transistors formed at least in part by a doped portion of the substrate 220-b (e.g., in accordance with the transistor structure 200, transistors configured in a CMOS arrangement). By including the transistors 380-b and 390-b in locations above the substrate 220-a, the memory structure 400 may support improved flexibility for distributing decoding and shunting circuitry throughout a memory die, which may improve area utilization, or semiconductor substrate material utilization, among other benefits.

In some examples, memory arrays 110-b or memory cells 105-b may be arranged as a plurality of tiles (e.g., patches, subarrays) over the substrate 220-a, which may refer to a set of memory cells 105-b that are associated with a set of word line conductors 440-a (e.g., a set word line conductors 440-a arranged or distributed along the x-direction), and the set of digit line conductors 410-a (e.g., arranged or distributed along the y-direction) that may be coupled with the set of memory cells 105-b by activation of such a set of word line conductors 440-a. For example, the memory array 110-b-a may be associated with a first tile the memory array 110-b-2 may be associated with a second tile. A tile, or some portion thereof, may be selected or enabled by a set of transistors (e.g., a set or subset of transistors 380-b along the y-direction), which may be configured to couple respective digit line conductors 410-a with circuitry outside the tile (e.g., via a respective intermediate line conductor 465-a) based at least on part on activating (e.g., biasing) a deck selection conductor 475-a. In some examples, a tile, or some portion thereof, may be shunted by a set of transistors (e.g., a set or subset of transistors 390-*b* along the y-direction), which may be configured to couple respective digit line conductors 410-*a* with one or more plate conductors 460-*a* based at least in part on activating (biasing) a shunt selection conductor 485-*a*.

Activation of deck selection conductors 475 (e.g., for selecting a deck or tile of memory cells 105, or for performing a signal development operation, such as when transistors 380 are operated in a cascode configuration) or shunt selection conductors 485 may be associated with power consumption or latency, which may be related to the building of charge on the respective conductor during such an activation. In some examples, relatively longer deck selection conductors 475 or shunt selection conductors 485 (e.g., along the y-direction) may be associated with relatively greater power consumption or relatively longer latency, which may be due to a relatively greater intrinsic capacitance or a relatively greater charge leakage associated with the relatively longer length, among other phenomena. In accordance with examples as disclosed herein, various configurations of deck selection conductors 475 and shunt selection conductors 485, among other features, may be implemented to trade off or otherwise support design and performance characteristics such as power consumption, layout complexity, operational complexity, and other characteristics. For example, for a set of rows of memory cells 105 (e.g., of a tile, associated with a set of word line conductors 440-*a* along the x-direction), columns of memory cells 105 along the y-direction may be arranged or subdivided into one or more sets along the y-direction, such that each of the one or more sets of columns may be independently addressable. In some examples, such techniques may be supported by subdividing deck selection conductors 475, shunt selection conductors 485, or both into shorter and independently addressable segments along the y-direction, which may be shorter than the extent of word line conductors 440 along the y-direction associated with a tile. In other words, a tile may be arranged such that a word line conductor 440 of the tile may activate a first quantity of cell selection components 330 (e.g., along a row of memory cells 105), a deck selection conductor 475 of the tile may activate a second quantity of transistors 380 that is less than or equal to the first quantity, and a shunt selection conductor 485 of the tile (where applicable) may activate a third quantity of transistors 390 that is less than or equal to the first quantity, where the third quantity may be the same as or different than the second quantity. Such techniques may support relatively shorter deck selection conductors 475 or shunt selection conductors 485 (e.g., along the y-direction), which may reduce power consumption or latency in an associated memory device or memory die, among other benefits.

Although the example of memory structure 400 illustrates an example where each level 420-*a* is associated with one memory array 110-*a*, the techniques described herein may be implemented to support memory devices or memory dies having multiple memory arrays 110 on a given level 420, which may include various common or independent addressing or accessing techniques, among other techniques. Implementing various deck layout configurations. Further, although the implementation of transistors 380-*b* and transistors 390-*b* associated with a given memory array 110-*b* show the pillars 470-*a* and 480-*a* as being within the same level 420-*a*, other implementations may be provided in accordance with the techniques disclosed herein. For example, transistors 380 or transistors 390 may be located or positioned in a different level 420 than an associated memory array 110, such as when deck selection, signal development, or decoding for multiple levels 420 is implemented in a common level (e.g., a level 420, a substrate level), and shunting is implemented in the respective levels 420 of each memory array 110.

Figure 5:
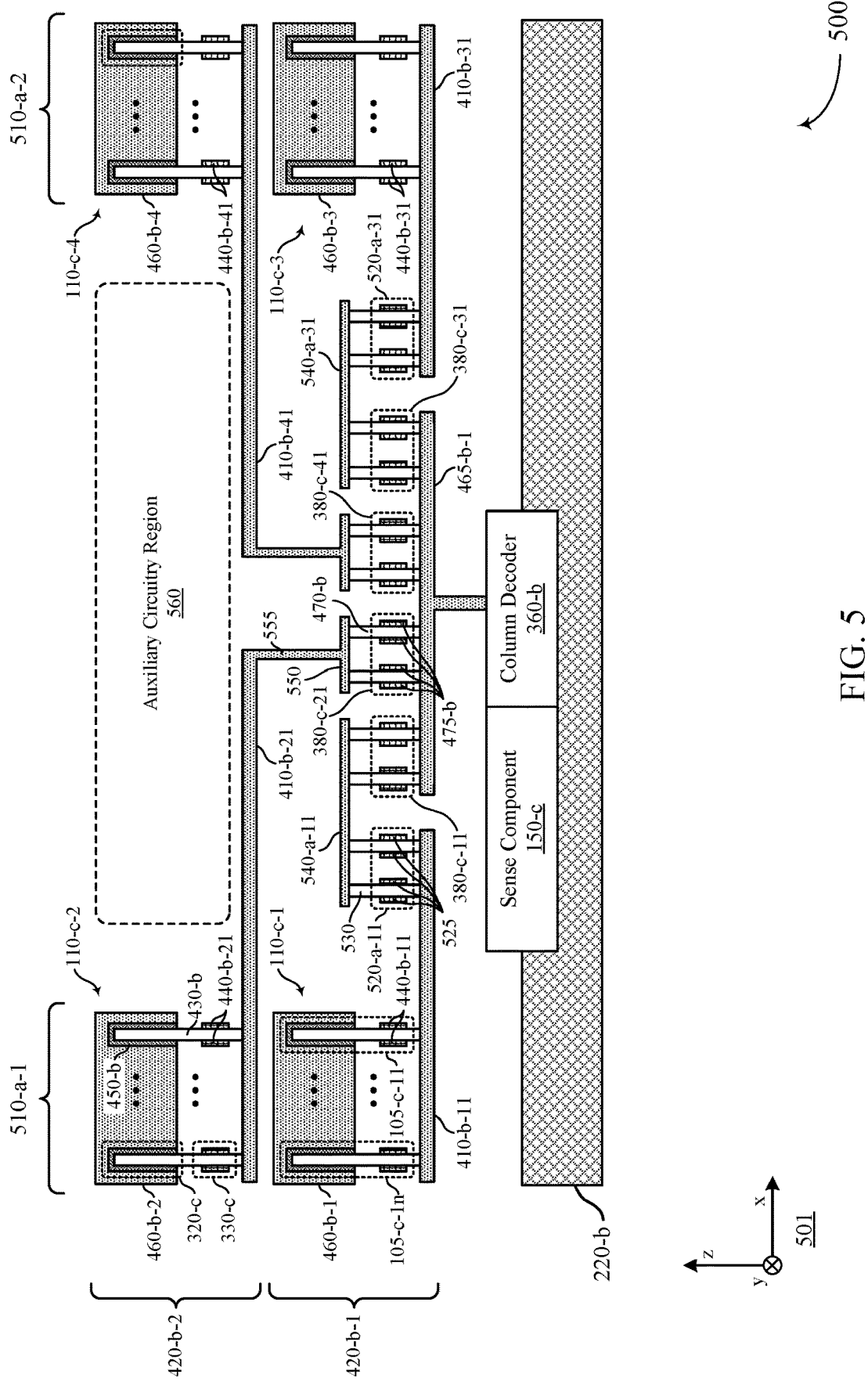

FIG. 5 illustrates an example of a memory structure 500 that supports deck selection layouts in a memory device in accordance with examples as disclosed herein. The memory structure 500 may be illustrative of portions of a memory device 100 or memory die that may be formed with or over a substrate 220-*b*, which may be an example of a substrate 220 described with reference to FIG. 2. The memory structure 500 may illustrate examples for implementing aspects of the circuit 300 described with reference to FIG. 3. For illustrative purposes, aspects of the memory structure 500 may be described with reference to an x-direction, a y-direction, and a z-direction of a coordinate system 501. The z-direction may be illustrative of a direction perpendicular to a surface of the substrate 220-*b* (e.g., a surface in an xy-plane, a surface upon or over which other materials may be deposited), and each of the related structures, illustrated by their respective cross section in an xz-plane, may extend for some distance, or be repeated for some quantity (e.g., according to a pitch dimension), or both along the y-direction. In some examples, for illustrative purposes, the x-direction may be aligned with or referred to as a column direction (e.g., along a column of memory cells 105), and the y-direction may be aligned with or referred to as a row direction (e.g., along a row of memory cells 105). In some examples, the memory structure 500 may include alternative arrangements of components similar to those described with reference to the memory structure 400, including components with similar reference numerals, and descriptions of such components or their formation with reference to the memory structure 400 may be applicable to the components of the memory structure 500.

The memory structure 500 illustrates an example of memory arrays 110 associated with different levels 420. For example, the memory arrays 110-*c*-1 and 110-*c*-3 may be associated with a level 420-*b*-1 at a first height or position relative to the substrate 220-*b*, and the memory arrays 110-*c*-2 and 110-*c*-4 may be associated with a level 420-*b*-2 at a second (e.g., different) height or position relative to the substrate 220-*b* (e.g., above the level 420-*d*-1, relative to the substrate 220-*b*). Although the memory structure 500 illustrates an example with two levels 420-*b*, the described techniques may be applied in a memory structure having any quantity of two or more levels 420.

The memory structure 500 also illustrates an example of memory arrays 110 associated with different sets 510 of memory arrays 110 (e.g., different subsets of memory arrays 110 that may have different locations over a substrate 220 along the x-direction, along the y-direction, or both). For example, the memory arrays 110-*c*-1 and 110-*c*-2 may be associated with a set 510-*a*-1 and the memory arrays 110-*c*-3 and 110-*c*-4 may be associated with a set 510-*a*-2. In some examples, memory arrays 110 of the sets 510 may be coupled with or otherwise share a same column decoder 360 (e.g., column decoder 360-*b*), but different sets 510 may be located on different sides or positions relative to common intermediate line conductors 465 or other circuitry. For example, the set 510-*a*-1 may be located on a first side of the intermediate line conductors 465-*b* (e.g., a left side) and the set 510-*a*-2 may be located on a second side of the intermediate line conductors 465-*b* (e.g., a right side).

At least some, if not each of the memory arrays 110-c may include a respective set of memory cells 105-c arranged or addressed according to rows (e.g., aligned along the y-direction, addressed according to a position along the x-direction) and columns (e.g., aligned along the x-direction, addressed according to a position along the y-direction). For example, a column of each of the memory arrays 110-c may include n memory cells, and each may be associated with (e.g., formed upon, formed in contact with, coupled with) a digit line conductor 410-b (e.g., an example of a digit line 130). A quantity of columns, m, may be formed by repeating the illustrated memory cells 105-c and digit line conductors 410-b, among other features, along the y-direction.

At least some, if not each of the memory cells 105-c in the memory structure 500 may include a respective capacitor 320-c and a respective cell selection component 330-c (e.g., a transistor). In the example of memory structure 500, each of the cell selection components 330-c may be formed as a vertical transistor, which may include a channel portion (e.g., a vertical channel) formed at least in part by a respective pillar 430-b, or portion thereof (e.g., along the z-direction), and a gate portion formed at least in part by a respective word line conductor 440-b (e.g., an example of a word line 120). In some examples, the gate portion of a cell selection component 330-c may be a portion or a region of a word line 120 or word line conductor 440-b that is operable to activate the channel portion (e.g., to modulate a conductivity of the channel portion) of the cell selection component 330-c. The word line conductors 440-b may extend from one memory cell 105-c to another memory cell 105-c along a direction, such as the y-direction (e.g., a row direction, along a row of memory cells 105-c), and may be coupled with a row component 125 (not shown) for selecting or activating a row of memory cells 105-c (e.g., by biasing the word line conductors 440-b).

In some examples, word line conductors 440-b of one memory array 110-c may be coupled or connected with word line conductors 440-b of another memory array 110-c, such that rows of memory cells 105-c may be commonly activated across multiple memory arrays 110-c, including memory arrays 110-c across multiple levels 420-b, or memory arrays 110-c across multiple sets 510-a, or both (e.g., by a common node or output of a shared row component 125, not shown). In examples that support a common, shared, or otherwise concurrent activation across memory arrays 110-c across multiple levels 420-b, the word line conductors 440-b-11 and 440-b-21 may be coupled with each other, or coupled with a common or shared output of a row component 125, or the word line conductors 440-b-31 and 440-b-41 may be coupled with each other, or coupled with a common or shared output of a row component 125, and so on. In examples that support a common, shared, or otherwise concurrent activation across memory arrays 110-c across multiple sets 510-a, the word line conductors 440-b-11 and 440-b-31 may be coupled with each other, or coupled with a common or shared output of a row component 125, or the word line conductors 440-b-21 and 440-b-41 may be coupled with each other, or coupled with a common or shared output of a row component 125, and so on. In examples that support a common, shared, or otherwise concurrent activation across memory arrays 110-c across multiple levels 420-d and sets 510-a, the word line conductors 440-b-11, 440-b-21, 440-b-31, and 440-b-41 may be coupled with each other, or coupled with a common or shared output of a row component 125, and so on.

In some examples, interconnections between word line conductors 440-b of different levels 420-b may be formed at least in part along a direction, such as the z-direction by one or more vias, sockets, or TSVs, which may be located at or near a boundary of the memory arrays 110-c (e.g., along the y-direction), among other locations relative to the memory arrays 110-c. In some examples, interconnections between word line conductors 440-b of different sets 510-a may be formed at least in part along the x-direction by one or more routing levels or layers, which may be located at a different position along the z-direction than the memory arrays 110-c, such as locations above, below, or between the memory arrays 110-c, among other locations.

Each capacitor 320-c for a memory cell 105-c may include a respective dielectric portion 450-b formed between a pillar 430-b associated with the memory cell 105-c and a plate conductor 460-b (e.g., an example of a plate line 140, a plate node, or a common plate). In some examples, a portion of a pillar 430-b of a capacitor 320-c may be a same material or combination of materials as a portion of the pillar 430-c of a corresponding cell selection component 330-c (e.g., a doped semiconductor material, a polycrystalline semiconductor). In some examples, a portion of a pillar 430-b of capacitor 320-c may be or include a different material or combination of materials as a portion of the pillar 430-b of a corresponding cell selection component 330-c (e.g., a metal or conductor portion, a metal layer deposited over a surface of the pillar 430-b). In some examples, the dielectric portions 450-b may be formed with a ferroelectric material operable to maintain a non-zero electric charge (e.g., corresponding to a stored logic state) in the absence of an electric field.

In the example of memory structure 500, each of the memory arrays 110-c may be associated with (e.g., coupled with, include, be accessed using) a respective plate conductor 460-b. Each of the plate conductors 460-b may be coupled with a plate component 145 (not shown) for respectively biasing the plate conductors 460-b. In the example of memory structure 500, each plate conductor 460-b may be associated with at least a column of memory cells 105-c. In some examples, each of the plate conductors 460-b may also extend along the y-direction along a row of memory cells 105-c, or some portion thereof, in which case each of the plate conductors 460-b may be associated with all of the memory cells 105-c of a respective memory array 110-c, or some subset of the columns of the respective memory array 110-c.

In the example of memory structure 500, at least some, if not each column of memory cells 105-c of at least some, if not each memory array 110-c may be associated with a respective transistor 380-c, which may also be formed as a vertical transistor. At least some, if not each transistor 380-c may be operable to couple a respective digit line conductor 410-b with an intermediate line conductor 465-b (e.g., an example of an intermediate line 365). In the example of memory structure 500, to support m columns per memory array 110-c, m intermediate line conductors 465-b may be formed along the y-direction, and each intermediate line conductor 465-b may be coupled or connected with a transistor 380-c associated with each memory array 110-c of each of the levels 420-d and each of the sets 510-a (e.g., intermediate line conductor 465-b-1 being coupled with transistors 380-c-11, 380-c-21, 380-c-31 and 380-c-41). The set of m intermediate line conductors 465-b may be coupled with a column decoder 360-c, which may, in turn, be coupled with or otherwise operable to couple with a sense component 150-c. In some examples, the memory structure 500 may include additional vertical transistors (e.g., transistors 390 as described with reference to FIG. 4, not shown), which may enable shunting functionality of the memory structure 500.

At least some, if not each transistor 380-c may include a channel portion (e.g., a vertical channel) formed at least in part by one or more respective pillars 470-b and a gate portion formed at least in part by one or more respective deck selection conductors 475-b (e.g., an example of a deck selection line 375). In some examples, the gate portion of a transistor 380-c may be a portion or a region of a deck selection line 375 that is operable to activate the channel portion (e.g., to modulate a conductivity of the channel portion) of the transistor 380-c. The deck selection conductors 475-b may extend from one column of memory cells 105-c to another, or from one transistor 380-c to another, along a direction, such as the y-direction (e.g., along a row direction, along a row of memory cells 105), and may be coupled with a deck decoder 370 (not shown) for selecting or activating a memory array 110-c (e.g., by biasing the deck selection conductors 475-b, by activating a row or other set of transistors 380-c).

The example of memory structure 500 illustrates a configuration where each of the transistors 380 may be on a same level 420. For example, each of the transistors 380-c-11, 380-c-21, 380-c-31, and 380-c-41, and respective repetitions along the y-direction for a quantity of columns, may be within or otherwise associated with the level 420-b-1. In some examples, such a configuration may support the pillars 470-b and deck selection conductors 475-b for all the transistors 380-c of the memory structure 500 being formed with common processes, or being otherwise formed concurrently.

In some examples, the configuration of the memory structure 500 may be supported by respective conductors 540 operable for coupling between the intermediate line conductors 465-b and the digit line conductors 410-b of the level 420-b-1. For example, the conductor 540-a-11 may be operable for coupling between the intermediate line conductor 465-b-1 (e.g., via the transistor 380-c-11) and the digit line conductor 410-b-11 (e.g., via a transistor 520-a-11 or other circuitry), the conductor 540-a-31 may be operable for coupling between the intermediate line conductor 465-b-1 (e.g., via the transistor 380-c-31) and the digit line conductor 410-b-31 (e.g., via a transistor 520-a-31 or other circuitry), and so on.

In some examples, the conductors 540 may be formed as part of a metal layer processing, which may include various deposition operations, or etching operations, or both. In some examples, such processing may also include forming conductor portions 550 coupled with or otherwise associated with the each of the digit line conductors 410-b of the second level 420-b-2. Each of the conductor portions 550 may be coupled with the respective digit line conductor 410-b (e.g., along the z-direction) by a respective conductor portion 555 (e.g., a vertical conductor), which may include one or more vias, sockets, or TSVs between the digit line conductor 410-b and the respective conductor portion 550. In some examples, to relieve dimensional tolerances or precision requirements for connections between the levels 420-b (e.g., an "at pitch" tolerance, related to pitch or repetition of digit line conductors 410-b or memory cells 105-c along the y-direction, such as a column pitch), the conductor portions 555 may be implemented in a varying approach, such as a staggered approach, where conductor portions 555 of columns adjacent to each other along the y-direction may be located in different positions along the x-direction according to various staggering techniques or repetitions. A staggered approach may, among other benefits, improve interconnection accuracy or tolerance for interconnections between levels 420-b, or may support relatively larger cross-sectional area (e.g., in an xy-plane) for the top of the conductor portions 555 (e.g., an end relatively farther from the substrate 220-b) than at the bottom of the conductor portions 555, which may be associated with an etching process used to etch holes for depositing a conductive material for the conductor portions 555 (e.g., where such an etching process may expand an upper cross-section in an xy-plane as the etching proceeds downward along the z-direction).

At least some, if not each transistor 520-a may include a channel portion (e.g., a vertical channel) formed at least in part by one or more respective pillars 530 and a gate portion formed at least in part by one or more respective conductors 525. In some examples, the gate portion of a transistor 520-a may be a portion or a region of a conductor 525 that is operable to activate the channel portion (e.g., to modulate a conductivity of the channel portion) of the transistor 520-a. The conductors 525 may extend from one column of memory cells 105-c to another, or from one transistor 520-a to another, along a direction, such as the y-direction (e.g., along a row direction, along a row of memory cells 105).

In some examples, the pillars 530 may be formed with common processes, or common materials, as the pillars 470-b, in which case the transistors 520-a may be formed as a same type of transistor as the transistors 380-c (e.g., n-type transistors or p-type transistors). In some examples, the pillars 530 and pillars 470-b may be formed with different processes, or different materials, in which case the transistors 520-a may be formed as a different type of transistor than the transistors 380-c. Although the example of memory structure 500 illustrates an example with transistors 380-c coupled with (e.g., formed upon) the intermediate line conductors 465-b and the transistors 520-a coupled with (e.g., formed upon) the digit line conductors 410-b, in some examples, the relative positions may be swapped such that transistors 380-c may be coupled with (e.g., formed upon) the digit line conductors 410-b the and the transistors 520-a may be coupled with (e.g., formed upon) the intermediate line conductors 465-b.

The transistors 520-a may, in some examples, be activated according to various techniques to support the operation of the memory structure 500. In some examples, the transistors may be configured in an "always on" configuration, where the conductors 525 may be activated whenever power or voltage is applied to or provided to the memory structure 500, or whenever the memory structure 500 is operable for supporting access operations (e.g., operating in an active mode). In some examples, the transistors 520-a may be configured to be activated during an access of the first memory array, of the second memory array, of the third memory array, or of the fourth memory array, or of any combination thereof. In some examples, the transistors 520-a may be activated when a corresponding memory array 110-c is selected for an access operation, in which case the corresponding transistors 380-c and the corresponding transistors 520 may both be activated (e.g., activating the transistors 380-c-11 and 520-a-11, and the respective repeated transistors along the y-direction, during access of the memory array 110-c-1). In some examples, such a combined or concurrent activation may be performed using a deck decoder 370, among other circuitry. Although the example of memory structure 500 includes the transistors 520-a, in some examples, the transistors 520-a may be replaced with metal conductors (e.g., vias, sockets, TSVs)

that electrically connect the digit line conductors 410-b with the respective conductors 540-a.

In some examples, circuitry of a deck decoder 370 (not shown), the column decoder 360-b, or the sense component 150-c, or any combination thereof may be substrate-based, such as including transistors formed at least in part by a doped portion of the substrate 220-b (e.g., in accordance with the transistor structure 200, transistors configured in a CMOS arrangement). By including the transistors 380-c in locations above the substrate 220-b, the memory structure 500 may support improved flexibility for deck selection layouts, which may improve area utilization, or semiconductor substrate material utilization, among other benefits. Moreover, in some examples, such a configuration may support an auxiliary circuitry region 560 (e.g., within or otherwise associated with the level 420-b-2) to be allocated to other circuitry that supports the operation of the memory structure 500. For example, the auxiliary circuitry region 560 may provide a region for forming power or voltage supply circuitry, such as capacitors that support power or voltage regulation or other signal conditioning for operation of the memory structure 500. In some examples, the auxiliary circuitry region 560 may provide a location for capacitors (e.g., CTSA capacitors, integrator capacitors), which may support the operation of transistors 380 for access operation signal development.

Memory structure 500 illustrates another example where memory arrays 110-c or memory cells 105-c may be arranged as a plurality of tiles (e.g., patches, subarrays) over the substrate 220-b, which may refer to a set of memory cells 105-b that are associated with a set of word line conductors 440-a (e.g., a set word line conductors 440-a along the x-direction), and the set of digit line conductors 410-a (e.g., along the y-direction) that may be coupled with the set of memory cells 105-b by activation of such a set of word line conductors 440-a. For example, the memory array 110-c-1 may be associated with a first tile, the memory array 110-c-2 may be associated with a second tile, the memory array 110-c-3 may be associated with a third tile, and the memory array 110-c-4 may be associated with a fourth tile. In accordance with examples as disclosed herein, various configurations of deck selection conductors 475 or conductors 525 (or shunt selection conductors 485, where applicable), among other features, may be implemented to trade off or otherwise support design and performance characteristics such as power consumption, layout complexity, operational complexity, and other characteristics. For example, for a set of rows of memory cells 105 (e.g., of a tile, associated with a set of word line conductors 440-a along the x-direction), columns of memory cells 105 along the y-direction may be arranged or subdivided into one or more independently-addressable sets along the y-direction, which may reduce power consumption or latency in an associated memory device or memory die, among other benefits.

The examples of memory structures 400 and 500 illustrate various techniques for implementing deck selection in accordance with examples as disclosed herein, including techniques illustrated schematically in the circuit 300. In some examples, a memory device 100 or associated memory die may implement multiple instances of one of the memory structures 400 or 500. For example, either of the memory structures 400 or 500 may be associated with a cross-sectional area (e.g., a span or extent along the x-direction and y-direction, a span or extent in an xy-plane) or a pitch (e.g., a distance of repetition along the x-direction, a distance of repetition along the y-direction), and one or more aspects of the respective memory structure may be repeated or extended along the x-direction, or y-direction, or both to expand a storage capacity of a memory device 100 or associated memory die. In some examples, each such repetition may be independently operable or addressable, which may support various aspects of parallel or otherwise concurrent access operations among repetitions of the respective memory structure. In some examples, a memory device 100 or associated memory die may implement instances of either or both of the memory structures 400 or 500, or may combine aspects of two or more other respective memory structures.

Figure 6:
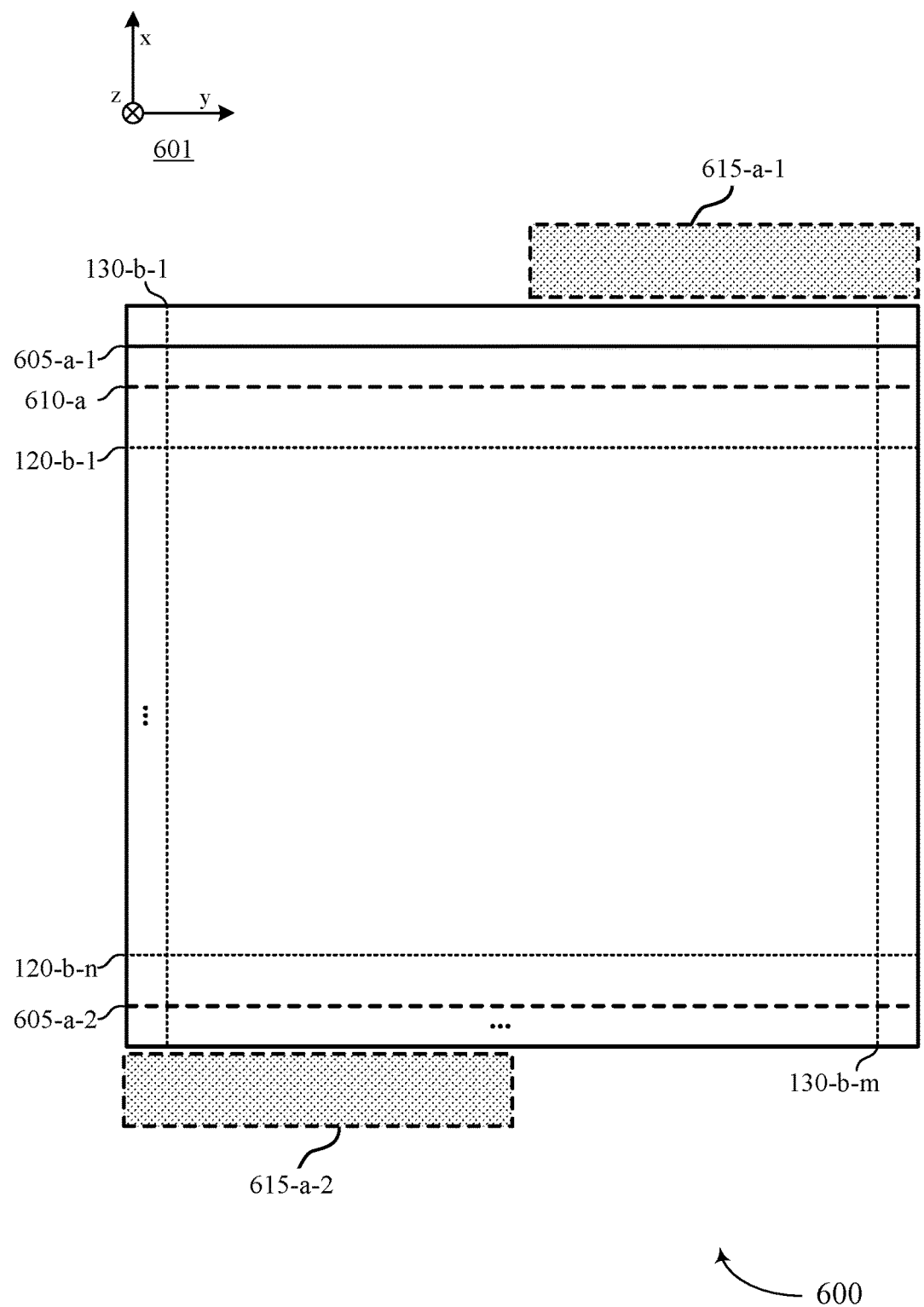
FIGS. 6 through 9 illustrate examples of memory tiles that support deck selection layouts in a memory device in accordance with examples as disclosed herein.

FIG. 6 illustrates an example of a memory tile 600 that supports deck selection layouts in a memory device in accordance with examples as disclosed herein. The memory tile 600 may be illustrative of portions of a memory device 100 or a memory die that may be formed over a substrate, such as a substrate 220 described with reference to FIGS. 2, 4, and 5. The memory tile 600 may illustrate examples for implementing aspects of the circuit 300 described with reference to FIG. 3. The memory tile 600 may be associated with (e.g., located at) a level 420 as described with reference to FIGS. 4 and 5 (e.g., illustrating relative locations of features for implementing aspects of memory structures 400 or 500, at a level above the substrate 220), and may include or be otherwise associated with circuitry configured to couple the memory tile 600 with circuitry outside the memory tile 600. In some cases, the memory tile 600 may be coupled with circuitry located at one or more other levels 420. For illustrative purposes, aspects of the memory tile 600 may be described with reference to an x-direction, a y-direction, and a z-direction of a coordinate system 601. The z-direction may be illustrative of a direction perpendicular to a surface of the substrate 220, such that the illustration of the memory tile 600 may be interpreted as a top-down view. In some examples, for illustrative purposes, the x-direction may be aligned with or referred to as a column direction (e.g., along a column of memory cells 105), and the y-direction may be aligned with or referred to as a row direction (e.g., along a row of memory cells 105).

The memory tile 600 illustrates an example of a layout of digit lines 130 aligned along a first direction (e.g., digit lines 130-b-1 through 130-b-m, aligned along the x-direction) and word lines 120 aligned along a second direction (e.g., word lines 120-b-1 through 120-b-n, aligned along the y-direction). In some examples, word lines 120-b may span the memory tile 600 along the y-direction, and the digit lines 130-b may span the memory tile 600 along the x-direction. In some examples, the word lines 120 may include one or more conductors (e.g., the word line conductors 440) which may extend between successive columns of memory cells 105, or between successive cell selection components 330. The memory tile 600 may also include a plurality of memory cells 105 (not shown), which may be located (e.g., physically, electrically, logically) between or otherwise addressed at the respective intersections of each of the digit lines 130-b and each of the word lines 120-b. In some examples, the word lines 120-b may each be operable to activate a plurality of transistors (e.g., cell selection components 330, not shown) of the memory tile 600 to couple a respective storage element, of each memory cell 105 of a respective row of memory cells 105 (e.g., along the y-direction), with each digit line 130-b of the digit lines 130-b-1 through 130-b-n (e.g., each of the digit lines 130-b of the memory tile 600).

In accordance with examples as disclosed herein, the memory tile 600 may be selected or enabled by a set of transistors 380 (e.g., deck selection transistors, tile selection transistors, transistors of or otherwise associated with the memory tile 600, not shown), which may be configured to couple a respective digit line 130-*b* of the memory tile 600 with circuitry outside the memory tile 600 (e.g., a column decoder 360 or a sense component 150, among other circuitry, not shown). In some examples, at least some of such transistors 380 may be activated (e.g., for tile selection, for access operation signal development in a cascode arrangement) by an activation line 605-*a*-1, which may be an example of at least a portion of a deck selection line 375 or a deck selection conductor 475 as described herein. The example of activation line 605-*a*-1 may be implemented in layouts where a single activation line 605 activates a complete row of transistors 380 (e.g., one transistor 380 for each of the digit lines 130-*b*-1 through 130-*b*-*m*). In some examples, the memory tile 600 may include a second activation line 605-*a*-2, which may be implemented in layouts where multiple activation lines 605 are used to activate transistors 380 of the memory tile 600, such as respective subsets of transistors 380 of the memory tile 600 (e.g., where the activation line 605-*a*-1 activates a respective transistor 380 for each of a first subset of the digit lines 130-*b*-1 through 130-*b*-*m*, such as each transistor 380 of a right half of the digit lines 130-*b*, and the activation line 605-*a*-2 activates a respective transistor 380 for each of a second subset of the digit lines 130-*b*-1 through 130-*b*-*m*, such as a left half of the digit lines 130-*b*). In various examples, activation lines 605 may include or refer to one or more conductors (e.g., deck selection conductors 475) which may extend between successive deck selection transistors 380 (e.g., along the y-direction).

In some examples, the digit lines 130-*b* may be coupled with circuitry outside the memory tile 600 according to coupling regions 615, which may be examples of cross-sectional areas (e.g., in an xy-plane) where intermediate line conductors 465 may be located (e.g., socket regions, via regions). Accordingly, the coupling regions 615 may illustrate regions that support a coupling between digit lines 130-*b* and circuitry outside the memory tile 600. In various examples, coupling regions 615 may be included in the memory tile 600, or may be located between the memory tile 600 and an adjacent memory tile (not shown), or may be shared with one or more other memory tiles (e.g., when multiple memory tiles share or are otherwise associated with a common coupling region, such as a common socket or via region).

In some examples, the memory tile 600 may include a first coupling region 615-*a*-1 and a second coupling region 615-*a*-2, which may be located at an opposite end of the memory tile 600 from the coupling region 615-*a*-1 (e.g., along the x-direction). In some examples, the first coupling region 615-*a*-1 may support coupling a first subset of the digit lines 130-*b* of the memory tile 600 with circuitry outside the memory tile 600, and the coupling region 615-*a*-2 may support coupling a second subset of the digit lines 130-*b* of the memory tile 600 with the circuitry outside the memory tile 600. In some examples, digit lines 130-*b* that are associated with the activation line 605-*a*-1 (e.g., digit lines 130-*b* on the right side of the memory tile 600) may be coupled with outside circuitry via the coupling region 615-*a*-1, and digit lines 130-*b* that are associated the activation line 605-*a*-2 (e.g., the digit lines 130-*b* on the left side of the memory tile 600) may be coupled with outside circuitry via the coupling region 615-*a*-2. In some examples, the digit lines 130-*b* may be cut (e.g., electrically isolated) at the opposite end from where they are coupled with outside circuitry, which may provide an isolation from adjacent structures (e.g., digit lines 130 of an adjacent memory tile) or may provide room for other structures (e.g., via or socket features between memory tiles), or both, among other configurations.

The memory tile 600 may include or be otherwise associated with a plate node, which may be an example of plate lines 140, plate conductors 460, or another type of plate node or conductor. In some examples, the plate node may be a common plate for the memory tile 600, and may be coupled with each of the memory cells 105 associated with all of the digit lines 130-*b*-1 through 130-*b*-*m*. Using a common plate node for all of the memory cells 105 of a memory tile may support relatively simple decoding or biasing, or relatively fewer components for operating the memory tile, among other benefits.

In some examples, the memory tile 600 may include at least a first plate note and a second plate node, which may be biased or addressed independently. For example, in some cases a first plate node may be coupled with the memory cells 105 associated with a first set of digit lines 130-*b*, and the second plate node may be coupled with the memory cells 105 associated with a second set of digit lines 130-*b*. In some examples, the first set of digit lines 130-*b* may be those coupled with outside circuitry via the coupling region 615-*a*-1 (e.g., the digit lines 130-*b* on the right side of the memory tile 600), and the second set of digit lines 130-*b* may be those coupled with outside circuitry via the coupling region 615-*a*-2 (e.g., the digit lines 130-*b* on the left side of the memory tile 600). Using two plate nodes that are independently controlled may be associated with relatively higher performance (e.g., relatively lower latency, relatively lower cell disturbance) or relatively greater efficiency than using a single plate node, among other benefits.

In some examples, the memory tile 600 also may include an activation line 610-*a*, which may be an example of at least a portion of a deck shunting line 385 or a shunt selection conductor 485 as described herein. The activation line 610-*a* may be an example of an activation line aligned along the y-direction and operable to activate a row of transistors 390 (e.g., shunt transistors, not shown), each of which may be operable to couple a respective digit line 130-*b* of the digit lines 130-*b*-1 through 130-*b*-*m* with a plate node of or otherwise associated with the memory tile 600. In some examples, the activation line 610-*a* may include one or more conductors (e.g., the shunt selection conductors 485) which may extend between successive shunting transistors 390 (e.g., along the y-direction).

In accordance with examples as disclosed herein, the layout of activation lines (e.g., activation lines 605-*a*, activation line 610) represented by the memory tile 600 may be implemented to trade off or otherwise support design and performance characteristics such as power consumption, layout complexity, operational complexity, and other characteristics. In some examples, the activation line 605-*a*-1 may be the only activation line configured for deck selection or tile selection in the memory tile 600, which may support relatively lower manufacturing or operational complexity. In some examples, the memory tile 600 may include an activation line 605-*a*-1 near a first end of the memory tile 600 along the x-axis (e.g., near a more-positive position along the x-axis) and, in some examples, an activation line 605-*a*-2 near a second end of the memory tile 600 along the x-axis (e.g., opposite the first end, near a less-positive position along the x-axis). In some examples, such techniques may support a more-compact layout of the memory tile 600, or supporting circuitry (e.g., row decoders, column decoders), by supporting the implementation of coupling regions 615 for the digit lines 130-*b* of the memory tile 600 at opposite ends of the memory tile 600 along a given direction.

In some examples, the placement of the activation line 610-*a* along the x-direction may affect operational characteristics of the memory tile 600, which may be leveraged for various design tradeoffs. For example, the activation line 610-*a* may be located relatively near an edge of the memory tile 600 (e.g., between an end word line 120-*b* and an edge of the memory tile 600, along the x-direction) such that the word lines 120-*b* are all on one side of the activation line 610-*a* (e.g., along the x-direction). Such an arrangement may be associated with some memory cells 105 along a digit line 130-*b* being relatively far from the activation line 610-*a* (e.g., at an opposite end of the memory tile 600 along the x-direction) which may be associated with relatively slower or less-effective shunting or equalization of such memory cells 105, or may be associated with an asymmetry because shunting may be relatively close to a coupling region 615 for some digit lines 130-*b* and relatively far from a coupling region 615 for some other digit lines 130-*b*. However, such a location for an activation line 610 may support favorable layout or decoding characteristics. In some other examples, the activation line 610-*a* may be located nearer to the middle of the memory tile 600 (e.g., along the x-direction) such that the activation line 610-*a* is positioned between subsets of word lines 120-*b* along the x-direction. Locating the activation line 610-*a* in a middle portion of the memory tile 600 along the x-direction (e.g., between subsets of word lines 120-*b*) may reduce shunting latency or improve shunting of equalization effectiveness, for example, by reducing or limiting a distance between shunting transistors 390 and memory cells 105 at an opposite end of the memory tile 600 along the x-direction.

Figure 7:
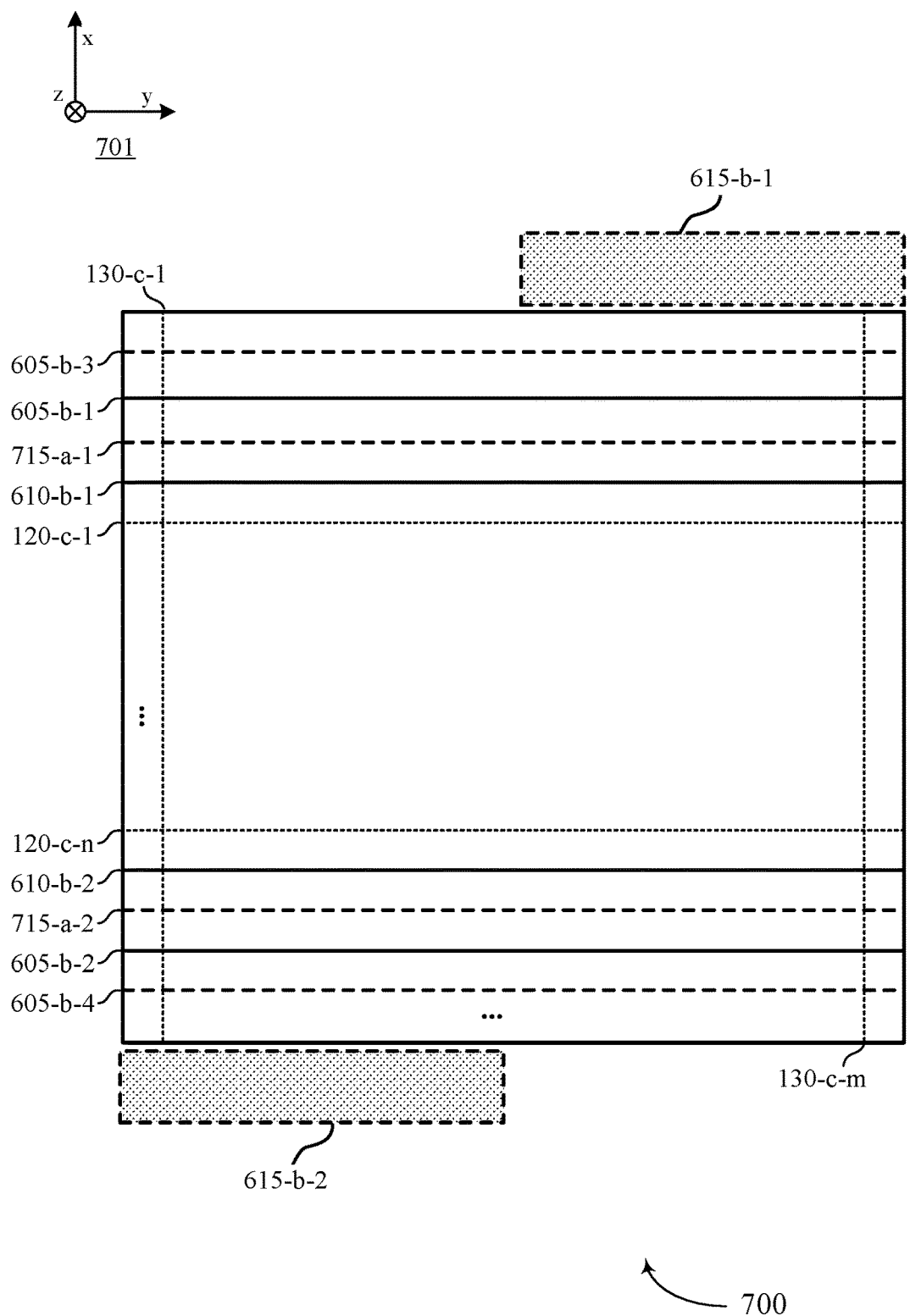

FIG. 7 illustrates an example of a memory tile 700 that supports deck selection layouts in a memory device in accordance with examples as disclosed herein. The memory tile 700 may be illustrative of portions of a memory device 100 or memory die that may be formed over a substrate 220 described with reference to FIGS. 2, 4 and 5. The memory tile 700 may illustrate examples for implementing aspects of the circuit 300 described with reference to FIG. 3. The memory tile 700 may be associated with a level 420 as described with reference to FIGS. 4 and 5 (e.g., illustrating relative locations of features for implementing aspects of memory structures 400 or 500, at a level above the substrate 220), and may include or otherwise be associated with circuitry configured to couple the memory tile 700 with circuitry outside the memory tile 700. In some cases, the memory tile 700 may be coupled with circuitry located at one or more other levels 420. For illustrative purposes, aspects of the memory tile 700 may be described with reference to an x-direction, a y-direction, and a z-direction of a coordinate system 701. The z-direction may be illustrative of a direction perpendicular to a surface of the substrate 220, such that the illustration of the memory tile 700 may be interpreted as a top-down view. In some examples, for illustrative purposes, the x-direction may be aligned with or referred to as a column direction (e.g., along a column of memory cells 105), and the y-direction may be aligned with or referred to as a row direction (e.g., along a row of memory cells 105). The memory tile 700 illustrates an example of a layout of digit lines 130 aligned along a first direction (e.g., digit lines 130-*c*-1 through 130-*c*-*m* aligned along the x-direction) and word lines 120 aligned along a second direction (e.g., word lines 120-*c*-1 through 120-*c*-*n*, aligned along the y-direction), which may be examples of digit lines 130 and word lines 120 as described herein.

In accordance with examples as disclosed herein, the memory tile 700 may be selected or enabled by a set of transistors 380 (not shown), which may be configured to couple a respective digit line 130-*c* of the memory tile 700 with circuitry outside the memory tile 700. In the example of memory tile 700, at least some of such transistors 380 may be activated by an activation line 605-*b*-1 or an activation line 605-*b*-2, which may be examples of at least a portion of a deck selection line 375 or a deck selection conductor 475 as described herein. The example of the two activation lines 605-*b*-1 and 605-*b*-2 may be implemented in layouts where each of the activation line 605-*b* activates a separate row of transistors 380 (e.g., a first row of transistors 380 at one end of the memory tile 700 along the x-direction and a second row of transistors 380 at an opposite end of the memory tile 700 along the x-direction). For example, the activation line 605-*b*-1 may activate a respective transistor 380 for each of a first subset of the digit lines 130-*c*-1 through 130-*c*-*m*, such as a right half of the digit lines 130-*c* (e.g., for coupling via a coupling region 615-*b*-1), and the activation line 605-*b*-2 may activate a respective transistor 380 for each of a second subset of the digit lines 130-*c*-1 through 130-*c*-*m*, such as a left half of the digit lines 130-*c* (e.g., for coupling via a coupling region 615-*b*-2).

In some examples, the memory tile 700 may include activation lines 605-*b*-3 and 605-*b*-4, which may be examples of activation lines 605-*b* of one level that are configured for coupling digit lines 130 of another level 420 (e.g., a memory tile of another level, above or below the memory tile 700 relative to a substrate 220, not shown) with circuitry on another level 420. Such a layout of the memory tile 700 may be an example of a memory tile at a level 420-*b*-1 as described with reference to the memory structure 500. For example, for digit lines 130-*c* associated with the coupling region 615-*b*-1, the activation line 605-*b*-1 may be an example for implementing deck selection conductors 475-*b* associated with the transistor 380-*c*-11 (e.g., and other transistors 380 along the y-direction) and the activation line 605-*b*-3 may be an example for implementing conductors 457-*b* associated with the transistor 380-*c*-21 (e.g., and other transistors 380 along the y-direction), which may be associated with digit lines 130 of a memory tile on another level 420. Aspects of the memory structure 500 may be reflected for the digit lines 130-*c* associated with the coupling region 615-*b*-2, such that the activation line 605-*b*-2 may be an example for implementing deck selection conductors 475-*b* associated with the transistor 380-*c*-11 and the activation line 605-*b*-4 may be an example for implementing conductors 457-*b* associated with the transistor 380-*c*-21, which may be associated with digit lines 130 of a memory tile on another level 420.

The memory tile 700 may include or be otherwise associated with a plate node, which may be an example of plate lines 140, plate conductors 460, or another type of plate node or conductor. In some examples, the plate node may be a common plate for the memory tile 700, and may be coupled with each of the memory cells 105 associated with all of the digit lines 130-*c*-1 through 130-*c*-*m*. In some examples, the memory tile 700 may include at least a first plate note and a second plate node, which may be biased or addressed independently. For example, a first plate node may be coupled with the memory cells 105 associated with a first set of digit lines 130-*c* (e.g., digit lines 130-*c* associated with the coupling region 615-*b*-1) and the second plate node may be coupled with the memory cells 105 associated with a second set of digit lines 130-*c* (e.g., digit lines 130-*c* associated with the coupling region 615-*b*-2).

The memory tile 700 also may include activation lines 610-*b*-1 and 610-*b*-2, which may be examples of at least a portion of deck shunting lines 385 or shunt selection conductors 485 as described herein. The activation lines 610-*b* may be an example of activation lines aligned along the y-direction and operable to activate respective rows of transistors 390 (e.g., shunt transistors, not shown), which may be operable to couple a respective digit line 130-*c* of the digit lines 130-*c*-1 through 130-*c*-*m* with a plate node of or otherwise associated with the memory tile 700 (e.g., a plate node common to the digit lines 130-*c* or the memory cells 105 of the memory tile 700). Each of the activation lines 610-*b* may include one or more conductors (e.g., shunt selection conductors 485) which may extend between successive shunting transistors 390 (e.g., along the y-direction). Such activation lines 610-*b* may be associated with respective rows of transistors 390 that span the entire memory tile 700 along the y-direction (e.g., each associated with transistors 390 for each of the digit lines 130-*c*-1 through 130-*c*-*m*), or some portion thereof (e.g., activation line 610-*b*-1 associated with transistors 390 for each of the digit lines 130-*c* coupled via the coupling region 615-*b*-1, activation line 610-*b*-2 associated with transistors 390 for each of the digit lines 130-*c* coupled via the coupling region 615-*b*-2). In some other examples of the memory tile 700, a single activation line 610 may be implemented, which may be located relatively near an edge of the memory tile 700 (e.g., along the x-direction), or between subset of word lines 120-*c* (e.g., at a middle position along the x-direction).

In some examples, the memory tile 700 may include one or more activation lines 715-*a*, which may be examples of at least a portion of conductors 525 as described herein. The activation lines 715-*a* may be an example of activation lines aligned along the y-direction and operable to activate respective rows of transistors 520 (e.g., transistors configured in an "always on" configuration, or when the memory tile 700 is operating in an active mode, not shown), which may be operable to couple a respective digit line 130-*c* of the digit lines 130-*c*-1 through 130-*c*-*m* with a respective conductor 540, as described with reference to FIG. 5. Each of the activation lines 715-*a* may include one or more conductors which may extend between successive transistors 520 (e.g., along the y-direction). Such activation lines 715-*a* may be associated with respective rows of transistors 520 that span a portion of the memory tile 700 (e.g., activation line 715-*a*-1 associated with transistors 520 for each of the digit lines 130-*c* coupled via the coupling region 615-*b*-1, activation line 715-*a*-2 associated with transistors 520 for each of the digit lines 130-*c* coupled via the coupling region 615-*b*-2). In some examples, activation lines 715-*a* may be omitted, such as when connections between digit lines 130-*c* and respective conductors 540 are implemented via metal conductors instead of transistors 520.

In accordance with examples as disclosed herein, the layout of activation lines (e.g., activation lines 605-*a*, activation lines 610-*b*, activation lines 715-*a*) represented by the memory tile 700 may be implemented to trade off or otherwise support design and performance characteristics such as power consumption, layout complexity, operational complexity, and other characteristics. For example, including two activation lines 610-*b*-1 and 610-*b*-2 may improve shunting symmetry (e.g., manufacturing symmetry, operational symmetry) compared to techniques where a memory tile includes a single activation line 610 located near an edge of the memory tile 700. However, such techniques may involve relatively higher power consumption than when a single activation line 610 is implemented. Further, by including activation lines 715-*a*, the memory tile 700 may include transistors 380 that are operable to couple more than one memory tile with circuitry outside the respective memory tile, which may support leveraging common manufacturing operations on a single level, or may support area for auxiliary circuitry on another level (e.g., in an auxiliary circuitry region 560), among other benefits.

Figure 8:
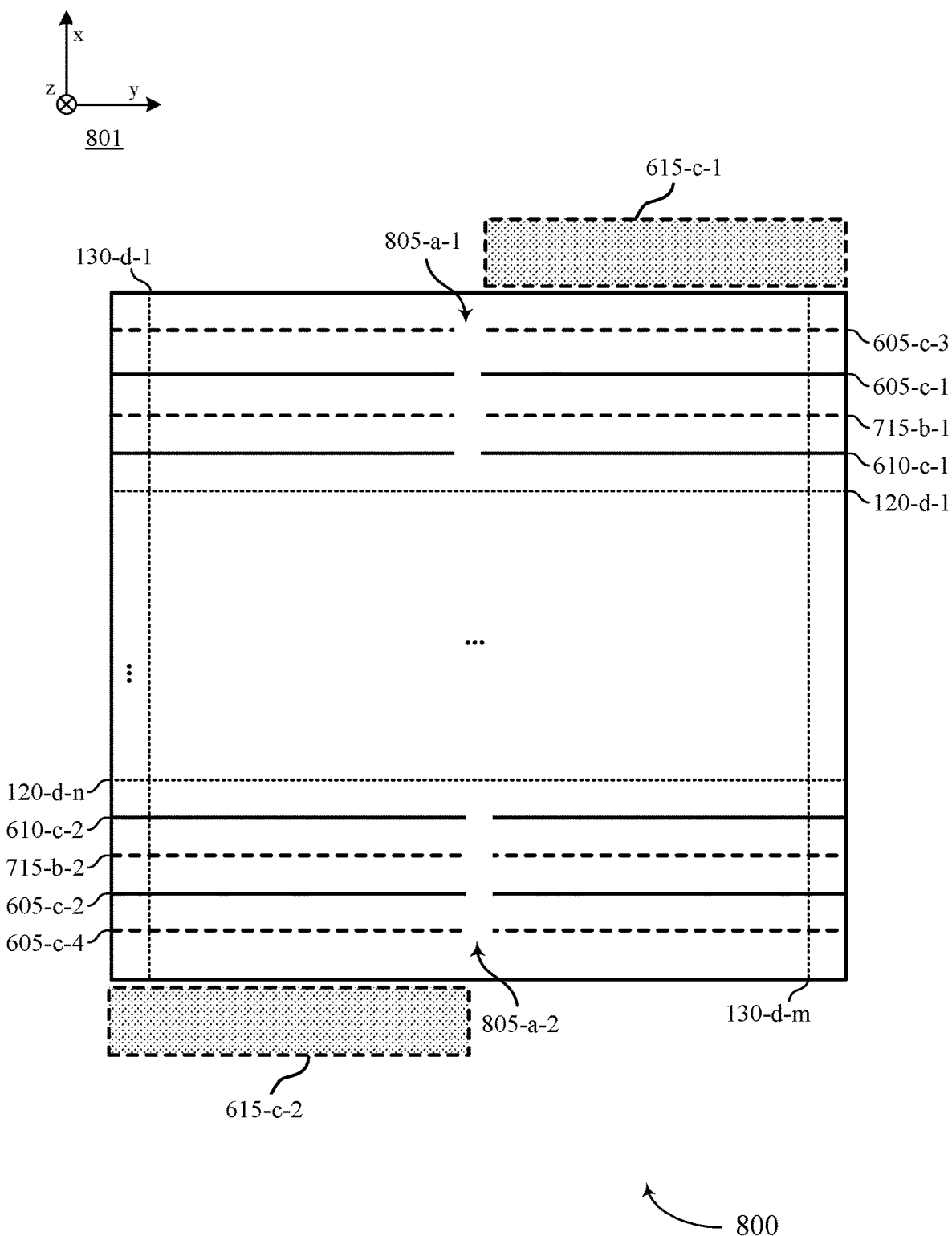

FIG. 8 illustrates an example of a memory tile 800 that supports deck selection layouts in a memory device in accordance with examples as disclosed herein. The memory tile 800 may be illustrative of portions of a memory device 100 or memory die that may be formed over a substrate 220 described with reference to FIGS. 2, 4 and 5. The memory tile 800 may illustrate examples for implementing aspects of the circuit 300 described with reference to FIG. 3. The memory tile 800 may be associated with (e.g., located at) a level 420 as described with reference to FIGS. 4 and 5 (e.g., illustrating relative locations of features for implementing aspects of memory structures 400 or 500, at a level above the substrate 220), and may include or otherwise be associated with circuitry configured to couple the memory tile 800 with circuitry outside the memory tile 800. In some cases, the memory tile 800 may be coupled with circuitry located at one or more other levels 420. For illustrative purposes, aspects of the memory tile 800 may be described with reference to an x-direction, a y-direction, and a z-direction of a coordinate system 801. The z-direction may be illustrative of a direction perpendicular to a surface of the substrate 220, such that the illustration of the memory tile 800 may be interpreted as a top-down view. In some examples, for illustrative purposes, the x-direction may be aligned with or referred to as a column direction (e.g., along a column of memory cells 105), and the y-direction may be aligned with or referred to as a row direction (e.g., along a row of memory cells 105).

The memory tile 800 illustrates an example of a layout of digit lines 130 aligned along a first direction (e.g., digit lines 130-*d*-1 through 130-*d*-*m* aligned along the x-direction) and word lines 120 aligned along a second direction (e.g., word lines 120-*d*-1 through 120-*d*-*n*, aligned along the y-direction), which may be examples of digit lines 130 and word lines 120 as described herein. The memory tile 800 also may include activation lines 605-*c*-1, 605-*c*-2, 605-*c*-3, 605-*c*-4, 610-*c*-1, 610-*c*-2, 715-*b*-1, and 715-*b*-2, which may be examples of such features as described with reference to the memory tile 700 of FIG. 7. However, in some examples, any one or more of such activation lines may be omitted from other memory tile layouts that support the described techniques. Moreover, although some aspects of the memory tile 800 are described relative to aspects of the memory tile 700, such techniques may be implemented in accordance with any examples as disclosed herein, including those relative to the memory tile 600, among others.

The example of memory tile 800 illustrates an example where cut regions 805 may be implemented to shorten one or more of the activation lines as described herein (e.g., relative to the respective activation lines as described with reference to the memory tiles 600 or 700). For example, memory tile 800 may include a cut region 805-*a*-1, which may be implemented to shorten operable portions (e.g., portions toward the right of the illustrated layout) of activation lines 605-*c*-1 and 610-*c*-1 and, where applicable, activation lines 605-*c*-3 and 715-*b*-1. The memory tile 800 also may include a cut region 805-*a*-2, which may be implemented to shorten operable portions (e.g., portions toward the left of the illustrated layout) of activation lines 605-*c*-2 and 610-*c*-2 and, where applicable, activation lines 605-*c*-4 and 715-*b*-2.

In some implementations, the cut regions 805 may be implemented as an etching operation, a trenching operation, or some other removal operation after each of the respective activation lines are formed (e.g., after activation lines 605, 610, and 715 are formed along the y-direction by one or more deposition or removal operations), which may leave electrically isolated (e.g., floating, inactive) portions of material associated with the formation of the respective activation lines. For example, after implementation of the cut region 805-*a*-1, portions of the activation lines to the left of the cut region 805-*a*-1 may be electrically isolated or floating and, after implementation of the cut region 805-*a*-2, portions of the activation lines to the right of the cut region 805-*a*-2 may be electrically isolated of floating. In other examples, activation lines 605, activation lines 610, or activation lines 715, or any combination thereof, may be formed without such isolated or floating portions (e.g., with or without cut regions 805), and may be otherwise formed with respective terminations along the y-direction that are not near an opposite edge of the memory tile 800 along the y-direction (e.g., having electrical terminations along the y-direction that are between some pair of digit lines 130-*d*, such as terminations between a boundary between digit lines 130-*d* that are associated with the coupling region 615-*c*-1 and the coupling region 615-*c*-2).

In the example of memory tile 800, respective activation lines may be long enough along the y-direction to support respective operations for those digit lines 130-*d* that are coupled via a respective coupling region 615. For example, activation lines 605-*c*-1 and 610-*c*-1 and, where applicable, activation lines 605-*c*-3 and 715-*b*-1, may span a distance along the y-direction that is long enough to perform respective operations for the digit lines 130-*c* coupled with external circuitry via the coupling region 615-*c*-1, and activation lines 605-*c*-2 and 610-*c*-2 and, where applicable, activation lines 605-*c*-4 and 715-*b*-2, may span a distance along the y-direction that is long enough to perform respective operations for the digit lines 130-*c* coupled with external circuitry via the coupling region 615-*c*-1. In various examples, such operations may be supported by a plate node that is common to all of the memory cells 105 of the memory tile 800, or by multiple plate nodes (e.g., a first plate node associated with memory cells 105 coupled via the coupling region 615-*c*-1 and a second plate node associated with memory cells 105 coupled via the coupling region 615-*c*-2).

In some examples, the memory tile 800 may provide improved performance by isolating or otherwise removing unnecessary or inoperable length of activation lines 605, 610, or 715. For example, the shorter lengths along the y-direction may be associated with a decreased intrinsic capacitance, or a decreased potential for charge leakage, either or both of which may be associated with reduced power consumption or reduced latency, among other advantages. In some examples, such improvements may outweigh manufacturing, design, or operational complexity that may be associated with cut regions 805 or other techniques for shortening activation lines 605, 610, or 715.

Figure 9:
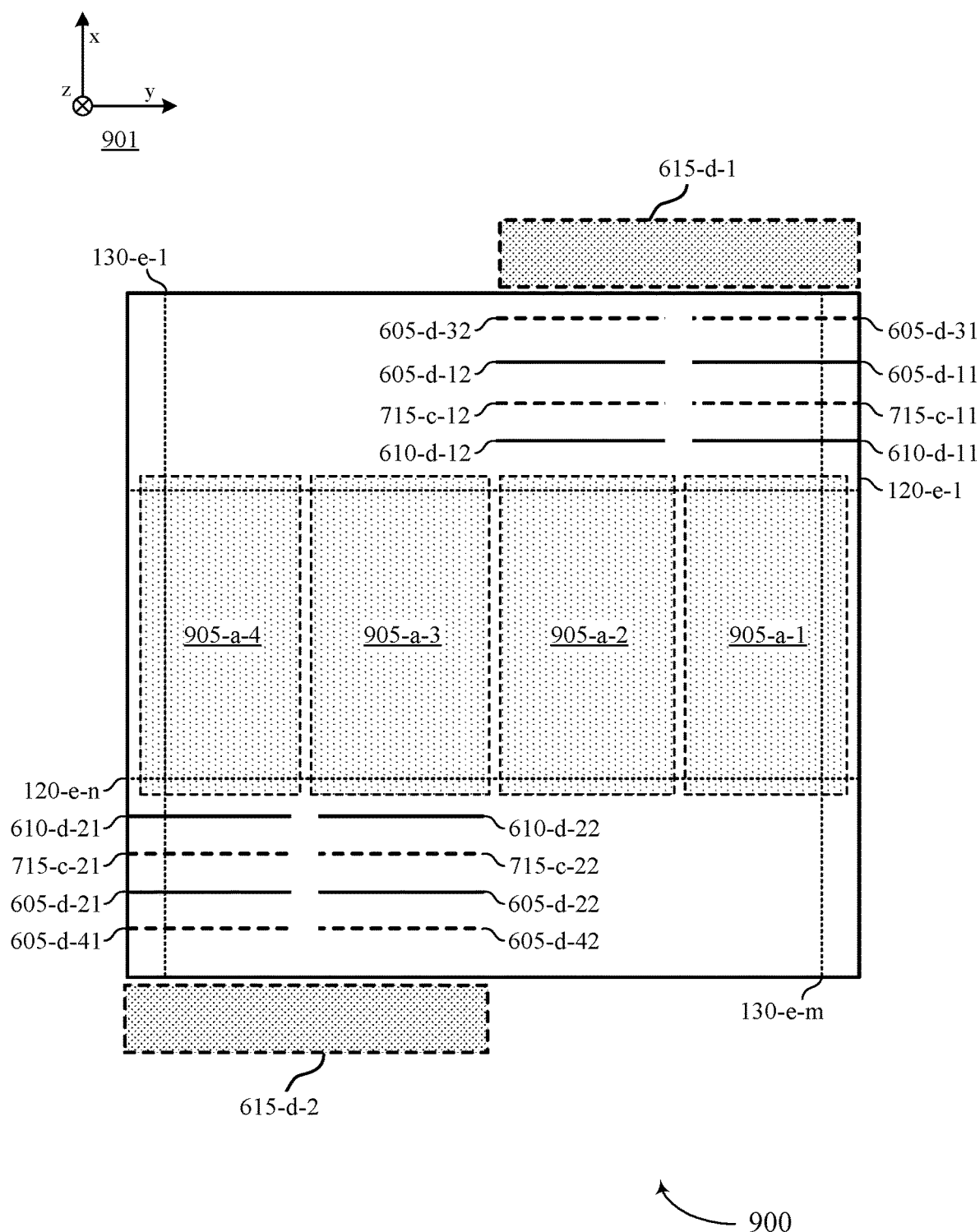

FIG. 9 illustrates an example of a memory tile 900 that supports deck selection layouts in a memory device in accordance with examples as disclosed herein. The memory tile 900 may be illustrative of portions of a memory device 100 or memory die that may be formed over a substrate 220 described with reference to FIGS. 2, 4 and 5. The memory tile 900 may illustrate examples for implementing aspects of the circuit 300 described with reference to FIG. 3. The memory tile 900 may be associated with (e.g., located at) a level 420 as described with reference to FIGS. 4 and 5 (e.g., illustrating relative locations of features for implementing aspects of memory structures 400 or 500, at a level above the substrate 220), and may include or otherwise be associated with circuitry configured to couple the memory tile 900 with circuitry outside the memory tile 900. In some cases, the memory tile 900 may be coupled with circuitry located at one or more other levels 420. For illustrative purposes, aspects of the memory tile 900 may be described with reference to an x-direction, a y-direction, and a z-direction of a coordinate system 901. The z-direction may be illustrative of a direction perpendicular to a surface of the substrate 220, such that the illustration of the memory tile 900 may be interpreted as a top-down view. In some examples, for illustrative purposes, the x-direction may be aligned with or referred to as a column direction (e.g., along a column of memory cells 105), and the y-direction may be aligned with or referred to as a row direction (e.g., along a row of memory cells 105).

The memory tile 900 illustrates an example of a layout of digit lines 130 aligned along a first direction (e.g., digit lines 130-*e*-1 through 130-*e*-*m* aligned along the x-direction) and word lines 120 aligned along a second direction (e.g., word lines 120-*e*-1 through 120-*e*-*n*, aligned along the y-direction), which may be examples of digit lines 130 and word lines 120 as described herein. The memory tile 800 also includes activation lines 605, 610, and 715 that may be subdivided (e.g., physically, spatially, logically) into independently controllable portions (e.g., relative to such features as described with reference to the memory tile 800 of FIG. 8). Although some aspects of the memory tile 900 are described relative to aspects of the memory tile 800, such techniques may be implemented in accordance with any examples as disclosed herein, including memory tiles 600 and 700, among others.

Memory tile 900 illustrates an example where activation lines associated with respective coupling regions 615 may be subdivided for increased addressing flexibility and performance. For example, for the coupling region 615-*d*-1, the memory tile 900 illustrates an implementation of activation lines 605-*d*-11 and 605-*d*-12 for deck or tile activation (e.g., for selection or signal development for the memory tile 900) and activation lines 610-*d*-11 and d10-*d*-12 for shunting (e.g., for memory cells 105 of the memory tile 900). Where applicable, for the coupling region 615-*d*-1, the memory tile 900 illustrates an example implementation of activation lines 605-*d*-31 and 605-*d*-32 for deck or tile activation (e.g., for another memory tile, different than the memory tile 900, which may be above or below the memory tile 900 relative to a substrate). Further, where applicable, for the coupling region 615-*d*-1, the memory tile 900 illustrates an example implementation of activation lines 715-*c*-11 and 715-*c*-12 for coupling digit lines 130-*e* with respective conductors 540 (e.g., in an "always on" configuration). The memory tile 900 illustrates that similar techniques may be implemented for other coupling regions, such as the coupling region 615-*d*-2. Although the respective activation lines are illustrated as spanning approximately half the memory tile 900 along the y-direction (e.g., for an implementation where respective access lines are formed across half the memory tile 900), in other examples, such activation lines may originally span the full dimension of the memory tile 900 prior to being cut or trenched (e.g., in accordance with one or more cut regions 805 as described with reference to FIG. 8). Moreover, although the memory tile 900 illustrates an example where halves of the memory tile 900 (e.g., associated with respective coupling regions 615) are subdivided into two groups, and two plate nodes, activation lines may be subdivided into any quantity of two or more groups in accordance with the described techniques.

In various examples, the layout of memory tile 900 may be accompanied by a plate node that is common to all of the memory cells 105 of the memory tile 900, or by multiple plate nodes. As illustrated, the memory tile 900 may include four plate regions 905 (e.g., plate regions 905-*a*-1 through 905-*a*-4), which may illustrate respective cross-sectional areas (e.g., in an xy-plane) or memory cells 105 associated with a given plate node. The example of plate regions 905 illustrate that the described techniques may be supported with multiple plate nodes for a given coupling region 615, or with a respective plate node for each set of subdivided activation lines (e.g., subdivided activation lines 605, 610, or 715, where applicable). In other examples of the described techniques for activation line subdivision, each of the coupling regions 615 may be associated with a common plate node (e.g., in accordance with two plate regions 905, not shown), among other examples.

In some examples, the memory tile 900 may provide further improved performance by isolating or otherwise removing unnecessary or inoperable length of activation lines 605, 610, or 715, and also by further subdividing operable lengths of activation lines 605, 610, and 715 into independently-addressable segments (e.g., and, in some examples, respective independently-addressable plate nodes). The combination of such techniques may be associated with a further decreased intrinsic capacitance, or a further decreased potential for charge leakage, either or both of which may be associated with further reduced power consumption or reduced latency, among other advantages (e.g., relative to the techniques described with reference to the memory tile 800). In some examples, such further improvements may outweigh manufacturing, design, or operational complexity that may be associated with such subdivision of activation lines 605, 610, or 715.

FIG. 10 shows a flowchart illustrating a method 1000 that supports deck selection layouts in a memory device in accordance with examples as disclosed herein. The operations of method 1000 may be implemented by a memory device or its components as described herein. For example, the operations of method 1000 may be performed by a memory device 100 or associated components or circuitry as described with reference to FIGS. 1 through 9. In some examples, a memory device may execute a set of instructions to control the functional elements of the device to perform the described functions. Additionally or alternatively, the memory device may perform aspects of the described functions using special-purpose hardware.

At 1005, the method may include performing an access operation on a row of memory cells of a level above a substrate of a memory die. The operations of 1005 may be performed in accordance with examples as disclosed herein. In some examples, aspects of the operations of 1005 may be performed by a memory controller 170 as described with reference to FIG. 1.

In some examples, performing the access operation may include biasing a word line to activate a plurality of first transistors of the level above the substrate for coupling a respective storage element of each memory cell of the row of memory cells with each digit line of a plurality of digit lines. In some examples, aspects of such operations may be performed by a row component 125 as described with reference to FIGS. 1 and 3.

In some examples, performing the access operation may include biasing a first activation line to activate a plurality of second transistors of the level above the substrate for coupling a respective digit line of a first set of digit lines of the plurality of digit lines with circuitry outside the level above the substrate. In some examples, aspects of such operations may be performed by a deck decoder 370 as described with reference to FIG. 3.

In some examples, performing the access operation may include biasing a second activation line to activate a plurality of third transistors of the level above the substrate for coupling a respective digit line of a second set of digit lines of the plurality of digit lines with the circuitry that outside the level above the substrate. In some examples, aspects of such operations may be performed by a deck decoder 370 as described with reference to FIG. 3.

In some examples, an apparatus as described herein may perform a method or methods, such as the method 1000. The apparatus may include, features, circuitry, logic, means, or instructions (e.g., a non-transitory computer-readable medium storing instructions executable by a processor), or any combination thereof for performing an access operation on a row of memory cells of a level above a substrate of a memory die. In some examples, the access operation may include biasing a word line to activate a plurality of first transistors of the level above the substrate for coupling a respective storage element of each memory cell of the row of memory cells with each digit line of a plurality of digit lines. In some examples, the access operation may include biasing a first activation line to activate a plurality of second transistors of the level above the substrate for coupling a respective digit line of a first set of digit lines of the plurality of digit lines with circuitry outside the level above the substrate. In some examples, the access operation may include biasing a second activation line to activate a plurality of third transistors of the level above the substrate for coupling a respective digit line of a second set of digit lines of the plurality of digit lines with the circuitry that outside the level above the substrate.

Figure 11:
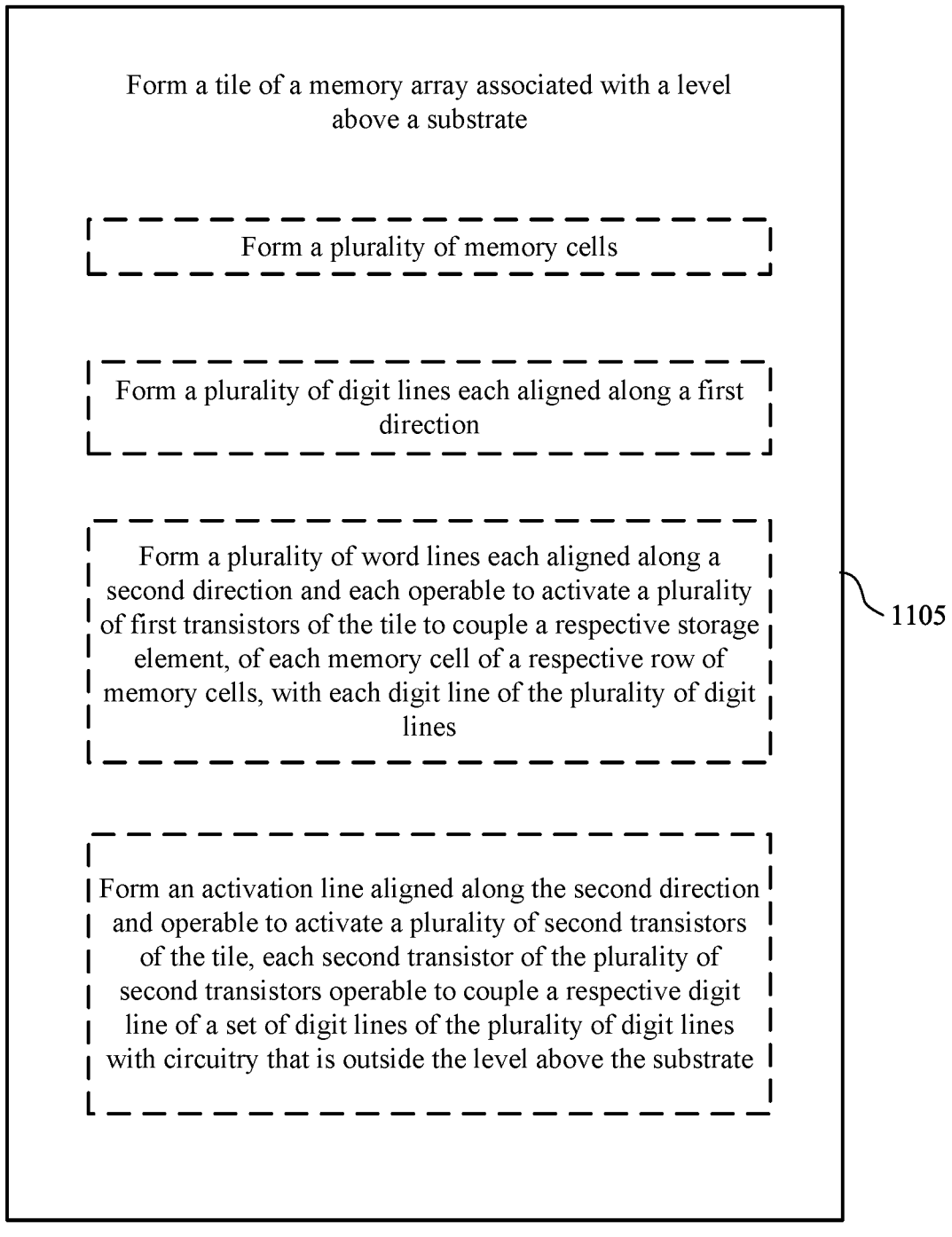

FIG. 11 shows a flowchart illustrating a method 1100 that supports deck selection layouts in a memory device in accordance with examples as disclosed herein. The operations of method 1100 may be implemented by a manufacturing system or one or more controllers associated with a manufacturing system. In some examples, one or more controllers may execute a set of instructions to control the functional elements of the manufacturing system to perform the described functions. Additionally or alternatively, one or more controllers may perform aspects of the described functions using special-purpose hardware.

At 1105, the method may include forming a tile of a memory array associated with a level above a substrate. The operations of 1105 may be performed in accordance with examples and techniques as disclosed herein, including one or more aspects described with reference to FIGS. 1 through 10.

In some examples, forming the tile may include forming a plurality of memory cells.

In some examples, forming the tile may include forming a plurality of digit lines each aligned along a first direction.

In some examples, forming the tile may include forming a plurality of word lines each aligned along a second direction and each operable to activate a plurality of first transistors of the tile to couple a respective storage element, of each memory cell of a respective row of memory cells, with each digit line of the plurality of digit lines.

In some examples, forming the tile may include forming an activation line aligned along the second direction and operable to activate a plurality of second transistors of the tile, each second transistor of the plurality of second transistors operable to couple a respective digit line of a set of digit lines of the plurality of digit lines with circuitry that is outside the level above the substrate.

In some examples, an apparatus as described herein may perform a method or methods, such as the method 1100. The apparatus may include, features, circuitry, logic, means, or instructions (e.g., a non-transitory computer-readable medium storing instructions executable by a processor), or any combination thereof for forming a tile of a memory array associated with a level above a substrate. In some examples, forming the tile may include forming a plurality of memory cells. In some examples, forming the tile may include forming a plurality of digit lines each aligned along a first direction. In some examples, forming the tile may include forming a plurality of word lines each aligned along a second direction and each operable to activate a plurality of first transistors of the tile to couple a respective storage element, of each memory cell of a respective row of memory cells, with each digit line of the plurality of digit lines. In some examples, forming the tile may include forming an activation line aligned along the second direction and operable to activate a plurality of second transistors of the tile, each second transistor of the plurality of second transistors operable to couple a respective digit line of a set of digit lines of the plurality of digit lines with circuitry that is outside the level above the substrate.

It should be noted that the methods described herein are possible implementations, and that the operations and the steps may be rearranged or otherwise modified and that other implementations are possible. Furthermore, portions from two or more of the methods may be combined.

An apparatus is described. The following provides an overview of aspects of the apparatus as described herein:

Aspect 1: An apparatus, including: a tile of a memory array associated with a level above a substrate, the tile including: a plurality of memory cells; a plurality of digit lines each aligned along a first direction; a plurality of word lines each aligned along a second direction and each operable to activate a plurality of first transistors of the tile to couple a respective storage element, of each memory cell of a respective row of memory cells, with each digit line of the plurality of digit lines; and an activation line aligned along the second direction and operable to activate a plurality of second transistors of the tile, each second transistor of the plurality of second transistors operable to couple a respective digit line of a set of digit lines of the plurality of digit lines with circuitry that is outside the level above the substrate.

Aspect 2: The apparatus of aspect 1, where the tile further includes: a second activation line aligned along the second direction and operable to activate a plurality of third transistors, each third transistor of the plurality of third transistors operable to couple a respective digit line of a second set of digit lines of the plurality of digit lines with the circuitry.

Aspect 3: The apparatus of aspect 2, where the activation line has a termination along the second direction that is located between a first pair of digit lines of the plurality of digit lines and the second activation line has a termination along the second direction that is located between a second pair of digit lines of the plurality of digit lines.

Aspect 4: The apparatus of any of aspects 2 through 3, where the tile further includes: a first plate node coupled with the storage elements of the memory cells associated with the set of digit lines; and a second plate node coupled with the storage elements of the memory cells associated with the second set of digit lines, where the second plate node is operable for biasing independently from the first plate node.

Aspect 5: The apparatus of aspect 4, where the tile further includes: a third activation line aligned along the second direction and operable to activate a plurality of fourth transistors, each fourth transistor of the plurality of fourth transistors operable to couple a respective digit line of the set of digit lines with the first plate node; and a fourth activation line aligned along the second direction and operable to activate a plurality of fifth transistors, each fifth transistor of the plurality of fifth transistors operable to couple a respective digit line of the second set of digit lines with the second plate node.

Aspect 6: The apparatus of any of aspects 2 through 5, where the digit lines of the set of digit lines are configured for the respective coupling with the circuitry via a first end of the tile along the first direction and the digit lines of the second set of digit lines are configured for the respective coupling with the circuitry via a second end of the tile along the first direction that is opposite from the first end.

Aspect 7: The apparatus of aspect 6, where the tile further includes: a fifth activation line aligned along the second direction and operable to activate a plurality of sixth transistors, each sixth transistor of the plurality of sixth transistors operable to couple a respective digit line of a third set of digit lines of the plurality of digit lines with the circuitry via the first end of the tile along the first direction; a sixth activation line aligned along the second direction and operable to activate a plurality of seventh transistors, each seventh transistor of the plurality of seventh transistors operable to couple a respective digit line of a fourth set of digit lines of the plurality of digit lines with the circuitry via the second end of the tile along the first direction.

Aspect 8: The apparatus of aspect 7, where the tile further includes: a first plate node coupled with the storage elements of the memory cells associated with the set of digit lines; and a second plate node coupled with the storage elements of the memory cells associated with the second set of digit lines; and a third plate node coupled with the storage elements of the memory cells associated with the third set of digit lines; and a fourth plate node coupled with the storage elements of the memory cells associated with the fourth set of digit lines, where each of the first plate node, the second plate node, the third plate node, and the fourth plate node is operable for biasing independently from others of the first plate node, the second plate node, the third plate node, and the fourth plate node.

Aspect 9: The apparatus of any of aspects 1 through 8, where each of the plurality of word lines has a respective height dimension, relative to the substrate, that overlaps with a height dimension of the activation line.

Aspect 10: The apparatus of any of aspects 1 through 9, where the tile further includes: a common plate node coupled with the storage elements of each memory cell of the plurality of memory cells.

Aspect 11: The apparatus of aspect 10, where the tile further includes: a seventh activation line aligned along the second direction and operable to activate a plurality of eighth transistors, each eighth transistor of the plurality of eighth transistors operable to couple a respective digit line of the plurality of digit lines with the common plate node.

Aspect 12: The apparatus of aspect 11, where the seventh activation line is located between a pair of word lines of the plurality of word lines along the first direction.

Aspect 13: The apparatus of any of aspects 1 through 12, where the circuitry that is outside the level above the substrate includes one or more column decoders, or one or more arrays of sense amplifiers, or a combination thereof.

Aspect 14: The apparatus of any of aspects 1 through 13, where the circuitry that is outside the level above the substrate includes a plurality of transistors formed at least in part from doped portions of the substrate.

An apparatus is described. The following provides an overview of aspects of the apparatus as described herein:

Aspect 15: An apparatus, including: a first tile of a memory array associated with a first level above a substrate, the first tile including: a plurality of first memory cells; a plurality of first digit lines each aligned along a first direction; and a plurality of first word lines each aligned along a second direction and each operable to activate a plurality of first transistors of the first tile to couple a respective storage element, of each first memory cell of a respective row of first memory cells, with each first digit line of the plurality of first digit lines; a second tile of the memory array associated with a second level above the substrate, the second tile including: a plurality of second memory cells; a plurality of second digit lines each aligned along the first direction; and a plurality of second word lines each aligned along the second direction and each operable to activate a plurality of second transistors of the second tile to couple a respective storage element of each second memory cell of a respective row of second memory cells with each second digit line of the plurality of second digit lines; a first activation line of the first level aligned along the second direction and operable to activate a plurality of third transistors of the first level, each third transistor of the plurality of third transistors operable to couple a respective first digit line of a set of first digit lines of the plurality of first digit lines with circuitry that is outside the first level above the substrate; and a second activation line of the first level aligned along the second direction and operable to activate a plurality of fourth transistors of the first level, each fourth transistor of the plurality of fourth transistors operable to couple a respective second digit line of a set of second digit lines of the plurality of second digit lines with the circuitry that is outside the first level above the substrate.

Aspect 16: The apparatus of aspect 15, further including: a third activation line of the first level aligned along the second direction and operable to activate a plurality of fifth transistors of the first level, each fifth transistor of the plurality of fifth transistors operable to couple a respective first digit line of a second set of first digit lines of the plurality of first digit lines with the circuitry that is outside the first level above the substrate; and a fourth activation line of the first level aligned along the second direction and operable to activate a plurality of sixth transistors of the first level, each sixth transistor of the plurality of sixth transistors operable to couple a respective second digit line of a second set of second digit lines of the plurality of second digit lines with the circuitry that is outside the first level above the substrate.

Aspect 17: The apparatus of aspect 16, where: the first activation line, the second activation line, the third activation line, and the fourth activation line each have a respective termination along the second direction that is located between a respective pair of first digit lines of the plurality of first digit lines.

Aspect 18: The apparatus of any of aspects 16 through 17, where: the first tile includes a first plate node coupled with the storage elements of the memory cells associated with the set of first digit lines and a second plate node coupled with the storage elements of the memory cells associated with the second set of first digit lines; the second tile includes a third plate node coupled with the storage elements of the memory cells associated with the set of second digit lines and a fourth plate node coupled with the storage elements of the memory cells associated with the second set of second digit lines, where each of the first plate node, the second plate node, the third plate node, and the fourth plate node is operable for biasing independently from others of the first plate node, the second plate node, the third plate node, and the fourth plate node.

Aspect 19: The apparatus of any of aspects 15 through 18, where: each of the plurality of first word lines has a respective height dimension, relative to the substrate, that overlaps with a height dimension of the first activation line and a height dimension of the second activation line.

Aspect 20: The apparatus of any of aspects 15 through 19, further including: a fifth activation line of the first level aligned along the second direction and operable to activate a plurality of seventh transistors of the first level, each seventh transistor of the plurality of seventh transistors operable to couple a respective first digit line of the plurality of first digit lines with a plate node of the first tile; and a sixth activation line of the second level aligned along the second direction and operable to activate a plurality of eighth transistors of the second level, each eighth transistor of the plurality of eighth transistors operable to couple a respective second digit line of the plurality of second digit lines with a plate node of the second tile.

Aspect 21: The apparatus of any of aspects 15 through 20, further including: a seventh activation line of the first level aligned along the second direction and operable to activate a plurality of ninth transistors of the first level, where the respective one of the plurality of first transistors is operable to couple the respective first digit line of the set of first digit lines of the plurality of first digit lines with the circuitry that is outside the first level above the substrate in combination with a respective one of the ninth transistors of the plurality of ninth transistors.

Aspect 22: The apparatus of any of aspects 15 through 21, where the circuitry that is outside the first level above the substrate includes one or more column decoders, or one or more arrays of sense amplifiers, or a combination thereof.

Aspect 23: The apparatus of any of aspects 15 through 22, where the circuitry that is outside the first level above the substrate includes a plurality of transistors formed at least in part from doped portions of the substrate.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a tile of a memory array associated with a level above a substrate, the tile comprising:
   a plurality of memory cells;
   a plurality of digit lines each aligned along a first direction;
   a plurality of word lines each aligned along a second direction and each operable to activate a plurality of first transistors of the tile to couple a respective storage element, of each memory cell of a respective row of memory cells, with each digit line of the plurality of digit lines; and
   an activation line aligned along the second direction and operable to activate a plurality of second transistors of the tile, each second transistor of the plurality of second transistors operable to couple a respective digit line of a set of digit lines of the plurality of digit lines with circuitry that is outside the level above the substrate.

2. The apparatus of claim 1, wherein the tile further comprises:
   a second activation line aligned along the second direction and operable to activate a plurality of third transistors, each third transistor of the plurality of third transistors operable to couple a respective digit line of a second set of digit lines of the plurality of digit lines with the circuitry.

3. The apparatus of claim 2, wherein the activation line has a termination along the second direction that is located between a first pair of digit lines of the plurality of digit lines and the second activation line has a termination along the second direction that is located between a second pair of digit lines of the plurality of digit lines.

4. The apparatus of claim 2, wherein the tile further comprises:
   a first plate node coupled with the storage elements of the memory cells associated with the set of digit lines; and
   a second plate node coupled with the storage elements of the memory cells associated with the second set of digit lines, wherein the second plate node is operable for biasing independently from the first plate node.

5. The apparatus of claim 4, wherein the tile further comprises:
   a third activation line aligned along the second direction and operable to activate a plurality of fourth transistors, each fourth transistor of the plurality of fourth transistors operable to couple a respective digit line of the set of digit lines with the first plate node; and
   a fourth activation line aligned along the second direction and operable to activate a plurality of fifth transistors, each fifth transistor of the plurality of fifth transistors operable to couple a respective digit line of the second set of digit lines with the second plate node.

6. The apparatus of claim 2, wherein the digit lines of the set of digit lines are configured for the respective coupling with the circuitry via a first end of the tile along the first direction and the digit lines of the second set of digit lines are configured for the respective coupling with the circuitry via a second end of the tile along the first direction that is opposite from the first end.

7. The apparatus of claim 6, wherein the tile further comprises:
   a fifth activation line aligned along the second direction and operable to activate a plurality of sixth transistors, each sixth transistor of the plurality of sixth transistors operable to couple a respective digit line of a third set of digit lines of the plurality of digit lines with the circuitry via the first end of the tile along the first direction;
   a sixth activation line aligned along the second direction and operable to activate a plurality of seventh transistors, each seventh transistor of the plurality of seventh transistors operable to couple a respective digit line of a fourth set of digit lines of the plurality of digit lines with the circuitry via the second end of the tile along the first direction.

8. The apparatus of claim 7, wherein the tile further comprises:
   a first plate node coupled with the storage elements of the memory cells associated with the set of digit lines; and
   a second plate node coupled with the storage elements of the memory cells associated with the second set of digit lines; and
   a third plate node coupled with the storage elements of the memory cells associated with the third set of digit lines; and
   a fourth plate node coupled with the storage elements of the memory cells associated with the fourth set of digit lines,
   wherein each of the first plate node, the second plate node, the third plate node, and the fourth plate node is operable for biasing independently from others of the first plate node, the second plate node, the third plate node, and the fourth plate node.

9. The apparatus of claim 1, wherein each of the plurality of word lines has a respective height dimension, relative to the substrate, that overlaps with a height dimension of the activation line.

10. The apparatus of claim 1, wherein the tile further comprises:
    a common plate node coupled with the storage elements of each memory cell of the plurality of memory cells.

11. The apparatus of claim 10, wherein the tile further comprises:
    a seventh activation line aligned along the second direction and operable to activate a plurality of eighth transistors, each eighth transistor of the plurality of eighth transistors operable to couple a respective digit line of the plurality of digit lines with the common plate node.

12. The apparatus of claim 11, wherein the seventh activation line is located between a pair of word lines of the plurality of word lines along the first direction.

13. The apparatus of claim 1, wherein the circuitry that is outside the level above the substrate comprises one or more column decoders, or one or more arrays of sense amplifiers, or a combination thereof.

14. The apparatus of claim 1, wherein the circuitry that is outside the level above the substrate comprises a plurality of transistors formed at least in part from doped portions of the substrate.

15. An apparatus, comprising:
a first tile of a memory array associated with a first level above a substrate, the first tile comprising:
a plurality of first memory cells;
a plurality of first digit lines each aligned along a first direction; and
a plurality of first word lines each aligned along a second direction and each operable to activate a plurality of first transistors of the first tile to couple a respective storage element, of each first memory cell of a respective row of first memory cells, with each first digit line of the plurality of first digit lines;
a second tile of the memory array associated with a second level above the substrate, the second tile comprising:
a plurality of second memory cells;
a plurality of second digit lines each aligned along the first direction; and
a plurality of second word lines each aligned along the second direction and each operable to activate a plurality of second transistors of the second tile to couple a respective storage element of each second memory cell of a respective row of second memory cells with each second digit line of the plurality of second digit lines;
a first activation line of the first level aligned along the second direction and operable to activate a plurality of third transistors of the first level, each third transistor of the plurality of third transistors operable to couple a respective first digit line of a set of first digit lines of the plurality of first digit lines with circuitry that is outside the first level above the substrate; and
a second activation line of the first level aligned along the second direction and operable to activate a plurality of fourth transistors of the first level, each fourth transistor of the plurality of fourth transistors operable to couple a respective second digit line of a set of second digit lines of the plurality of second digit lines with the circuitry that is outside the first level above the substrate.

16. The apparatus of claim 15, further comprising:
a third activation line of the first level aligned along the second direction and operable to activate a plurality of fifth transistors of the first level, each fifth transistor of the plurality of fifth transistors operable to couple a respective first digit line of a second set of first digit lines of the plurality of first digit lines with the circuitry that is outside the first level above the substrate; and
a fourth activation line of the first level aligned along the second direction and operable to activate a plurality of sixth transistors of the first level, each sixth transistor of the plurality of sixth transistors operable to couple a respective second digit line of a second set of second digit lines of the plurality of second digit lines with the circuitry that is outside the first level above the substrate.

17. The apparatus of claim 16, wherein:
the first activation line, the second activation line, the third activation line, and the fourth activation line each have a respective termination along the second direction that is located between a respective pair of first digit lines of the plurality of first digit lines.

18. The apparatus of claim 16, wherein:
the first tile comprises a first plate node coupled with the storage elements of the memory cells associated with the set of first digit lines and a second plate node coupled with the storage elements of the memory cells associated with the second set of first digit lines;
the second tile comprises a third plate node coupled with the storage elements of the memory cells associated with the set of second digit lines and a fourth plate node coupled with the storage elements of the memory cells associated with the second set of second digit lines,
wherein each of the first plate node, the second plate node, the third plate node, and the fourth plate node is operable for biasing independently from others of the first plate node, the second plate node, the third plate node, and the fourth plate node.

19. The apparatus of claim 15, wherein:
each of the plurality of first word lines has a respective height dimension, relative to the substrate, that overlaps with a height dimension of the first activation line and a height dimension of the second activation line.

20. The apparatus of claim 15, further comprising:
a fifth activation line of the first level aligned along the second direction and operable to activate a plurality of seventh transistors of the first level, each seventh transistor of the plurality of seventh transistors operable to couple a respective first digit line of the plurality of first digit lines with a plate node of the first tile; and
a sixth activation line of the second level aligned along the second direction and operable to activate a plurality of eighth transistors of the second level, each eighth transistor of the plurality of eighth transistors operable to couple a respective second digit line of the plurality of second digit lines with a plate node of the second tile.

21. The apparatus of claim 15, further comprising:
a seventh activation line of the first level aligned along the second direction and operable to activate a plurality of ninth transistors of the first level, wherein a respective one of the plurality of third transistors is operable to couple the respective first digit line of the set of first digit lines of the plurality of first digit lines with the circuitry that is outside the first level above the substrate in combination with a respective one of the plurality of ninth transistors.

22. The apparatus of claim 15, wherein the circuitry that is outside the first level above the substrate comprises one or more column decoders, or one or more arrays of sense amplifiers, or a combination thereof.

23. The apparatus of claim 15, wherein the circuitry that is outside the first level above the substrate comprises a plurality of transistors formed at least in part from doped portions of the substrate.

24. A method, comprising:
performing an access operation on a row of memory cells of a level above a substrate of a memory die, wherein the access operation comprises:
biasing a word line to activate a plurality of first transistors of the level above the substrate for coupling a respective storage element of each memory cell of the row of memory cells with each digit line of a plurality of digit lines;
biasing a first activation line to activate a plurality of second transistors of the level above the substrate for coupling a respective digit line of a first set of digit lines of the plurality of digit lines with circuitry outside the level above the substrate; and biasing a second activation line to activate a plurality of third transistors of the level above the substrate for coupling a respective digit line of a second set of digit lines of the plurality of digit lines with the circuitry that outside the level above the substrate.

25. A method comprising:

forming a tile of a memory array associated with a level above a substrate based at least in part on:

forming a plurality of memory cells;

forming a plurality of digit lines each aligned along a first direction;

forming a plurality of word lines each aligned along a second direction and each operable to activate a plurality of first transistors of the tile to couple a respective storage element, of each memory cell of a respective row of memory cells, with each digit line of the plurality of digit lines; and forming an activation line aligned along the second direction and operable to activate a plurality of second transistors of the tile, each second transistor of the plurality of second transistors operable to couple a respective digit line of a set of digit lines of the plurality of digit lines with circuitry that is outside the level above the substrate.

* * * * *